(12) United States Patent
Koning et al.

(10) Patent No.: US 8,716,671 B2
(45) Date of Patent: *May 6, 2014

(54) ENHANCED INTEGRITY PROJECTION LENS ASSEMBLY

(71) Applicants: Johan Joost Koning, Hillegom (NL); Stijn Willem Herman Karel Steenbrink, The Hague (NL); Bart Schipper, Nijkerk (NL)

(72) Inventors: Johan Joost Koning, Hillegom (NL); Stijn Willem Herman Karel Steenbrink, The Hague (NL); Bart Schipper, Nijkerk (NL)

( * ) Notice: Subject to any disclaimer, the term of this patent is extended or adjusted under 35 U.S.C. 154(b) by 3 days.

This patent is subject to a terminal disclaimer.

(21) Appl. No.: 13/722,774

(22) Filed: Dec. 20, 2012

(65) Prior Publication Data

US 2013/0256554 A1    Oct. 3, 2013

Related U.S. Application Data

(63) Continuation of application No. 12/901,468, filed on Oct. 8, 2010, now Pat. No. 8,362,441.

(60) Provisional application No. 61/250,336, filed on Oct. 9, 2009.

(51) Int. Cl.
*H01J 37/12*    (2006.01)

(52) U.S. Cl.
CPC ..................................... *H01J 37/12* (2013.01)
USPC ...................... 250/396 R; 250/398

(58) Field of Classification Search
USPC .............................................. 250/396 R, 398
See application file for complete search history.

(56) References Cited

U.S. PATENT DOCUMENTS

| | | | |
|---|---|---|---|
| 2,359,290 A | 10/1944 | Von Borries et al. | |
| 4,902,898 A | 2/1990 | Jones et al. | |
| 6,872,950 B2 | 3/2005 | Shimada et al. | |
| 6,946,662 B2 | 9/2005 | Ono et al. | |
| 8,362,441 B2 * | 1/2013 | Koning et al. | 250/396 R |
| 2005/0104013 A1 | 5/2005 | Stengl et al. | |

FOREIGN PATENT DOCUMENTS

| | | |
|---|---|---|
| JP | 2007266525 A | 10/2007 |
| JP | 2007266525 A | 10/2007 |
| NL | 2003619 C | 4/2011 |
| NL | 2003619 C | 4/2011 |
| WO | 2006004374 A | 1/2006 |
| WO | WO-2006004374 A1 | 1/2006 |
| WO | 2011043668 A1 | 4/2011 |
| WO | WO-2011043668 A1 | 4/2011 |

* cited by examiner

*Primary Examiner* — Jack Berman
(74) *Attorney, Agent, or Firm* — Blakely Sokoloff Taylor & Zafman

(57) ABSTRACT

The present invention relates to a projection lens assembly module for directing a multitude of charged particle beamlets onto an image plane located in a downstream direction, and a method for assembling such a projection lens assembly. In particular the present invention discloses a modular projection lens assembly with enhanced structural integrity and/or increased placement precision of its most downstream electrode.

24 Claims, 19 Drawing Sheets

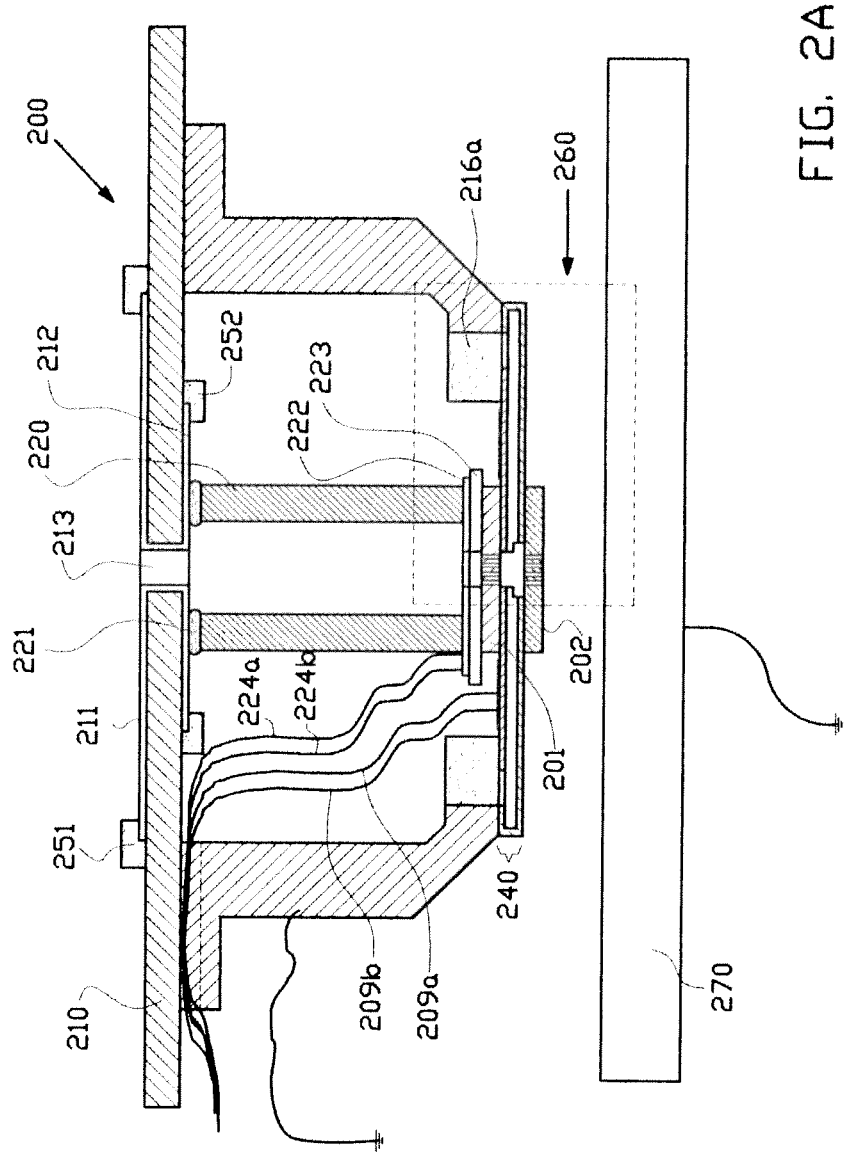

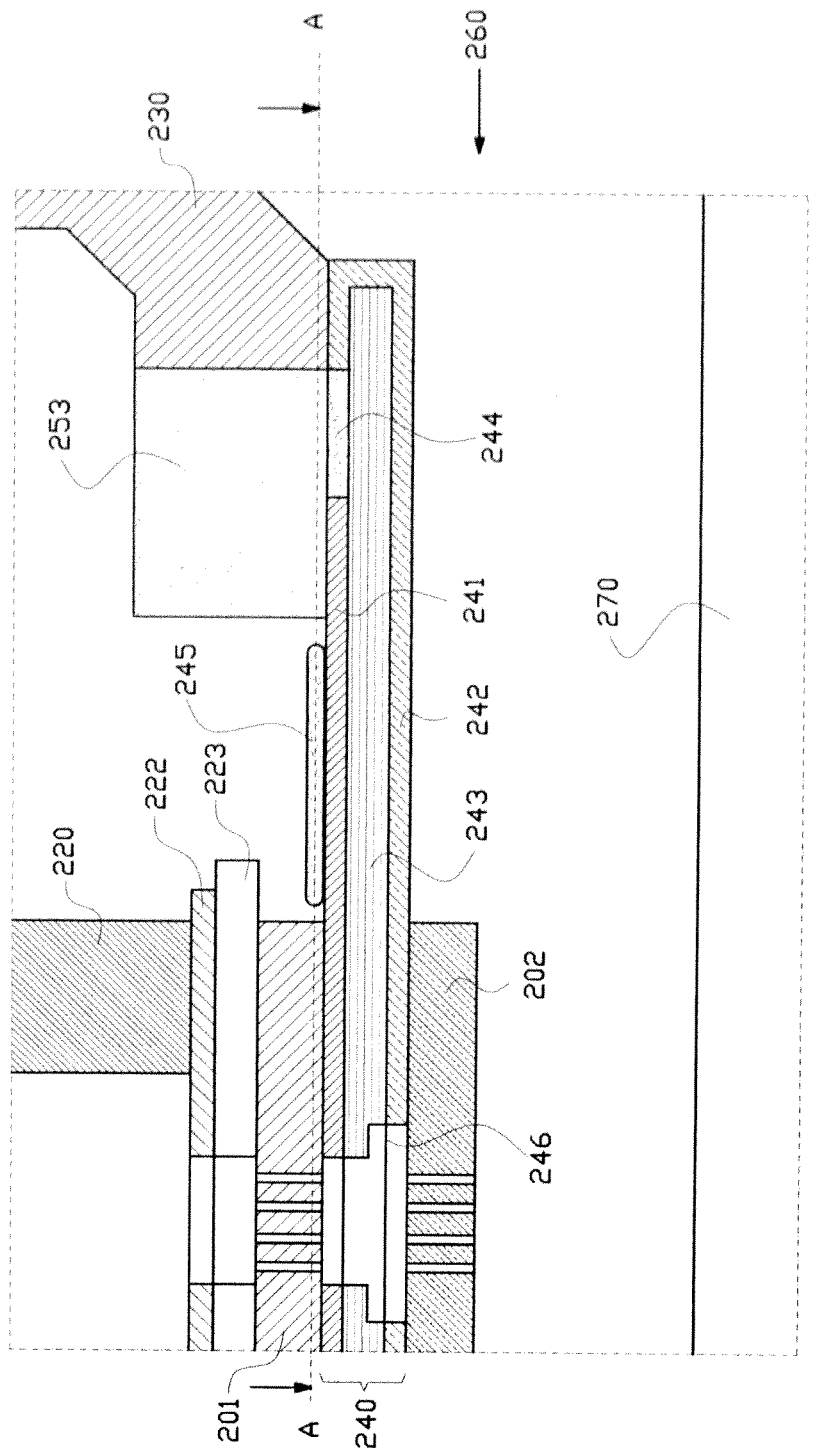

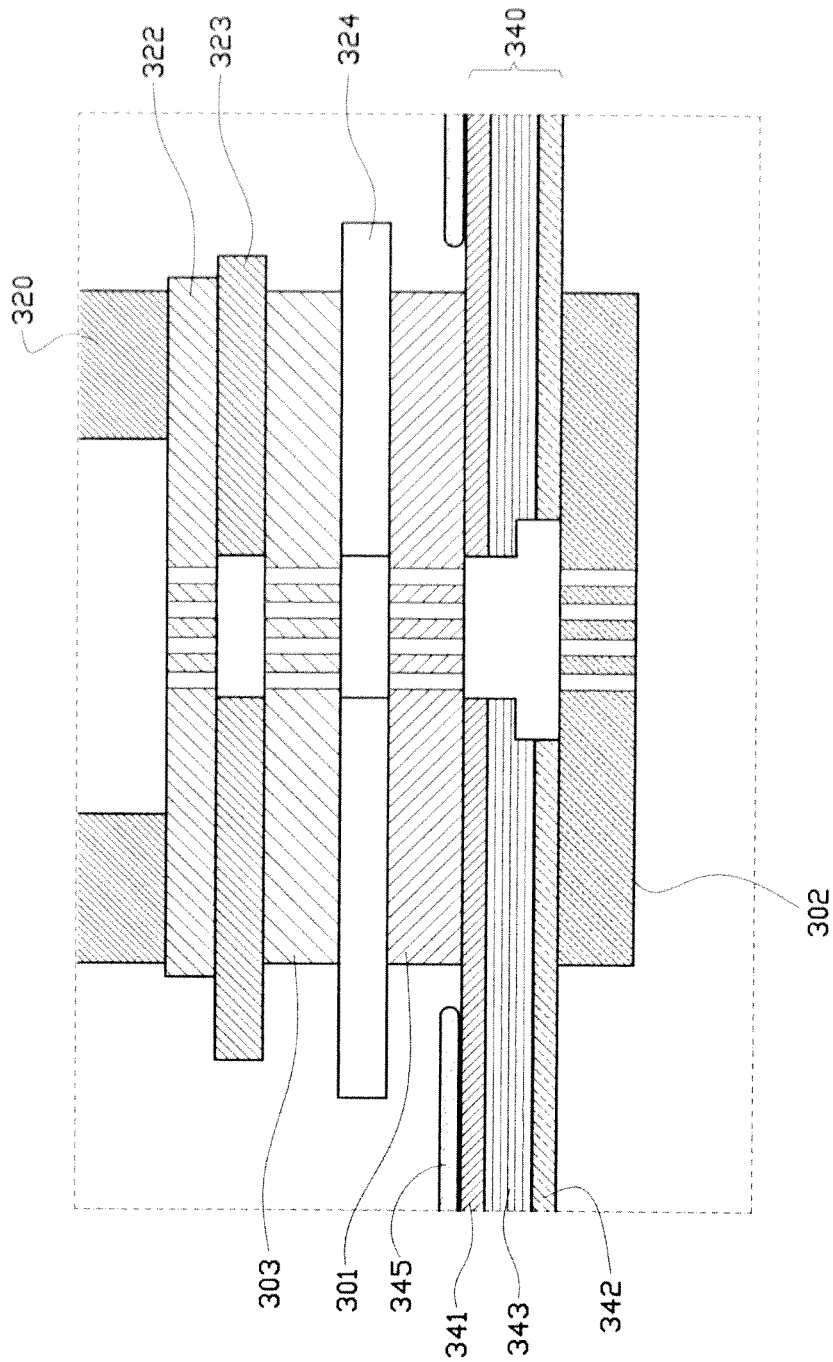

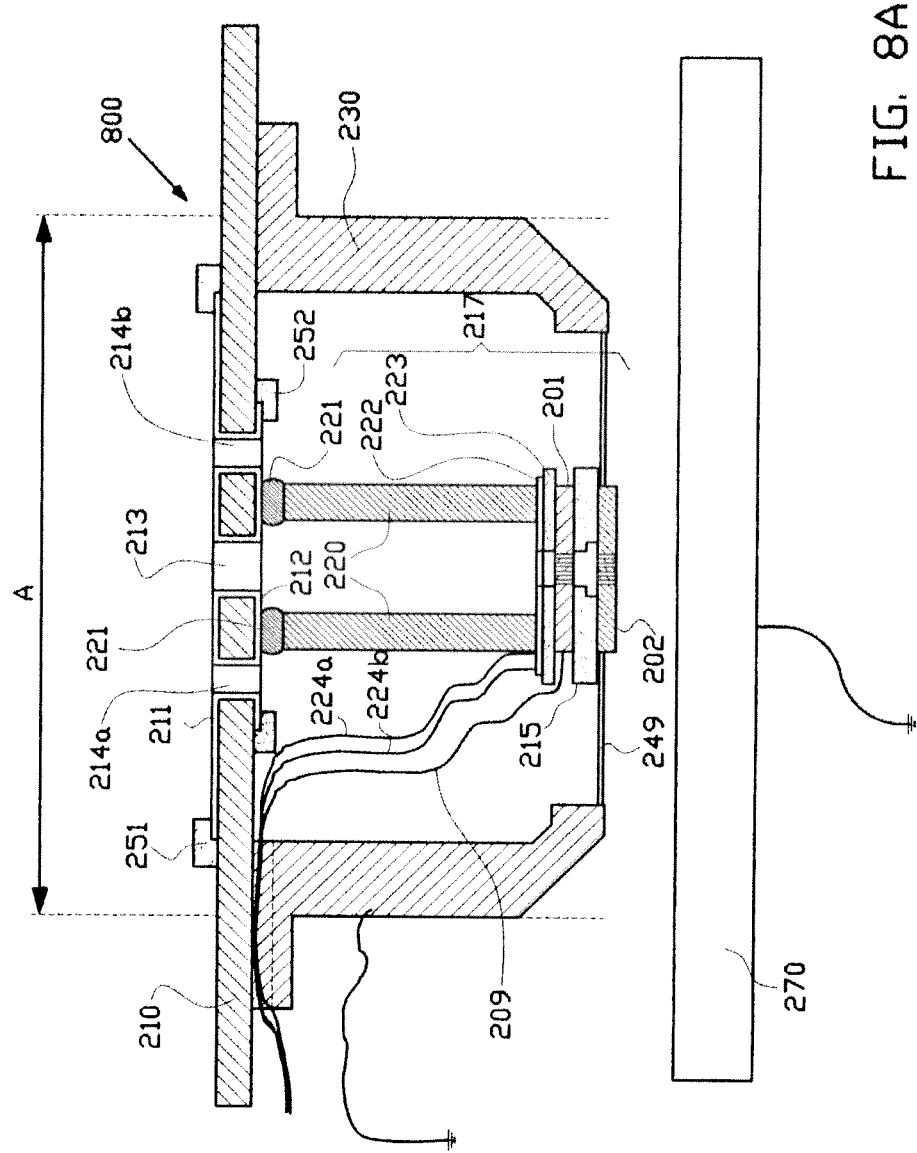

ENHANCED INTEGRITY PROJECTION LENS ASSEMBLY

CROSS-REFERENCE TO RELATED APPLICATION

The present patent application is a Continuation Application claiming the benefit of Non-Provisional application Ser. No. 12/901,468, filed Oct. 8, 2010, now pending, which application claims Priority from U.S. Provisional Application No. 61/250,336, filed Oct. 9, 2009, now expired.

FIELD OF THE INVENTION

The present invention relates to a projection lens assembly for directing a multitude of charged particle beamlets onto an image plane. In particular the present invention relates to a robust and compact projection lens assembly allowing easy handling.

BACKGROUND OF THE INVENTION

U.S. Pat. No. 6,946,662 discloses a lens assembly for directing a multitude of charged particle beamlets onto an image plane. The lens assembly comprises a plurality of electrodes having a beam passing region where a plurality of charged beam apertures are formed. The electrodes are stacked along an optical path with insulator members spacing the electrodes apart. At the edge of the electrodes, said electrodes are clamped together for forming a lens assembly. The image provided by the lens assembly is reduced and projected onto a wafer via a reduction electron optical system. The lens assembly is used to correct beam aberrations which occur later on in the path of projection when the beams are demagnified.

A disadvantage of the system disclosed in U.S. Pat. No. 6,946,662 is, that the lens assembly needs to be complex in order to provide for the required corrections.

U.S. Pat. No. 7,091,504 to Applicant discloses an electron beam exposure apparatus comprising a focusing electron optical system comprising an array of electrostatic lenses, wherein each lens focuses a corresponding individual beamlet to a cross-section smaller than 300 nm, directly onto the wafer. Since this system does not need a reduction electron optical system, the effects of beam aberrations due to this reduction electron optical system can be circumvented.

A disadvantage of the system disclosed in U.S. Pat. No. 7,091,504 is that the electron optical system needs to be arranged much closer to the target.

Furthermore, in order to provide a stable electrostatic field in the downstream direction, the electrode substrates of the prior art, as for example disclosed in U.S. Pat. No. 6,946,662, are thin and arranged close to each other, i.e. spaced apart by small distances using insulator members at the sides of the electrodes. Such thin electrodes form the weakest part of a projection lens assembly; the electrodes may break or deform easily when handled, and when sparks occur between the electrodes as a result of the high potential difference there between, the electrodes are usually damaged too severely to be of further use. Replacement of the electrodes can result in significant downtime of a lithography apparatus in which they are used.

It is a goal of the present invention to provide a structurally robust compact modular projection lens assembly for projecting a multitude of charged particle beamlets, e.g. tens of thousands of beamlets or more, directly onto a target. It is a further goal of the present invention to provide a modular projection lens assembly which can be easily handled and maintained and which may be placed as one unit.

It is a further goal of the present invention to provide a compact modular projection lens assembly that is easily assembled to within precise specifications, and a method for assembling such a projection lens assembly.

SUMMARY OF THE INVENTION

To this end, according to a first aspect, the present invention provides a projection lens assembly for directing a multitude of charged particle beamlets onto an image plane, said projection lens assembly comprising a first electrode and a second electrode for focusing one or more charged particle beamlets of the multitude of charged particle beamlets, a housing comprising a through-opening for allowing the multitude of charged particle beamlets to pass through, said first and second electrodes each comprising a lens hole-array aligned with the through-opening for allowing one or more charged particle beamlets of the multitude of charged particle beamlets to pass through, wherein said housing comprises a circumferential wall and has an upstream and a downstream distal edge, and the projection lens assembly further comprises: at least one support element comprising a through-opening for allowing the multitude of charged particle beamlets to pass through, wherein said at least one support element is attached to the housing, and wherein the first electrode and second electrode are supported by the at least one support element, wherein the first and second electrode are arranged in or near a plane defined by the downstream distal edge of the housing. During handling of projection the lens assembly, the electrodes are substantially protected by the circumferential wall of the housing. Moreover, as the electrodes are located at a downstream part of the housing, the projection lenses for the charged particle beamlets may be placed close to the target.

In an embodiment the first electrode and second electrode are attached to the support element by means of an adhesive connection. The second electrode can thus be placed very close to the target, i.e. at a distance in the range of 50 to 100 micron, as no clamps or screws are used which project further downstream than the second electrode itself. Moreover, during construction of the projection lens assembly, the distance between the electrodes may be easily adjusted by using more or less adhesive in the adhesive connection and then letting the adhesive cure.

In an embodiment the support element is constructed of a non-conductive material. The support element may thus be used as an electrical insulator.

In an embodiment the projection lens assembly comprises a support element of the one or more support elements at one or both of the downstream and upstream distal edge of the housing. In a preferred embodiment the projection tens assembly comprises a support element at the downstream distal edge of the housing and another support element at the upstream distal edge of the housing.

In an embodiment the second electrode forms a distal end of the projection lens assembly in the downstream direction. Thus the second electrode may be placed very close to the target, to within 50 micron.

In an embodiment the first and second electrodes are arranged on an upstream surface and a downstream surface of the support element respectively, the first electrode being spaced apart from said circumferential wall, and the support element bridging the distance between the first electrode ad the circumferential wall. As the most downstream electrode of the projection lens assembly assembly, the distance between the most downstream elect rode of the projection lens assembly and a target to be patterned may be minimized. Moreover the support element, in addition to supporting the electrodes, serves to disperse force exerted on the electrodes and prevents deformation thereof. Preferably the support element comprises a main layer of an insulating material, such as borosilicate glass, which may be easily machined to precise specifications and tolerances. As the electrodes are thus mounted robustly in the projection lens assembly and to some extent protected from shocks and other impact forces, the present invention provides a robust module which may be replaced relatively easily and in one piece.

In an embodiment an upstream surface of the support element is at least partially covered with a first conductive coating connected to the first electrode. Leads may easily be attached anywhere on the first coating to provide the first electrode with a potential for focusing the charged particle beamlets. Alternatively, the leads may be directly connected to the first electrode.

In an embodiment a downstream surface of the support element is substantially covered with a second conductive coating connected to the second electrode. The two coatings have a dual function. Firstly, they act as a conductor for establishing a potential difference between electrodes, and secondly the coatings substantially shield the downstream end of the lens assembly from external electromagnetic radiation and may thus form part of a Faraday cage.

In an embodiment the projection lens assembly further comprises a third electrode arranged upstream of the first electrode. Preferably, the third electrode and the second electrode are kept at constant potentials, whereas the potential of the first electrode may be calibrated to fixate the strength of focus for each individual projection lens assembly to a specified level. Thus an array of lenses for adjustable focusing charged particle beamlets is formed, for which an adjustment in focus does not substantially influence electrical fields outside the volume spanned by the third and second electrodes.

In an embodiment the second coating extends radially from the through-opening at the downstream surface of the support element across an outer edge of the support element to an outer peripheral area of the upstream surface of the support element, and the first coating extends radially outwards from the through-opening at the upstream surface of the support element. Preferably the second coating completely covers the downstream facing surface and outer edge of the support element. Conductive leads for the first electrode may be attached anywhere on the first coating which is conductively connected therewith. This facilitates placement of the leads for the electrodes In an embodiment the downstream facing and/or upstream facing surfaces of the support element are fortified with radially extending strips of adhesive. The supporting capacity of the support element can thus be increased, even after manufacture thereof.

In an embodiment the circumferential wall is electrically conductive and connected to the second coating. The circumferential wall and the second coating thus provide substantial electromagnetic shielding for the charged particle beamlets traversing the projection lens assembly. Moreover, a support element of this construction may be glued to the downstream distal edge of the circumferential wall using a conductive adhesive without requiring any further leads to be attached to the second coating or second electrode.

In an embodiment the support element further comprises dielectric breakdown protection structures at or near the periphery of the through-opening. Preferably the through-opening of the support element has a stepped diameter which is smaller near the upstream surface of the the support element. Additionally there may also be dielectric breakdown protection structures at or between the outer peripheries of the first and/or second coatings. The protection structures prevent sparking between the first and second electrodes, allowing higher voltages to be applied between the first and second electrodes and thus more uniform electric fields for focusing the charged particle beamlets.

In an embodiment the non-conductive material of the support element, preferably comprised of borosilicate glass, separates the first and second electrodes by a distance of about 200 microns or less.

In an embodiment the support element as well as the first electrode and/or second electrode are substantially planar.

In an embodiment the at least one support element comprises a first support element, a second support element and a cover element, each with a through-opening for the multitude of charged particle beamlets, wherein said cover element is arranged at the upstream distal edge of the circumferential wall, the second support element interconnecting the cover element with the first electrode or first support element. During manufacture of the lens assembly, once the circumferential wall and the support element have been attached to each other, the cover element can be used to substantially seat off the upstream side of the housing. Any space between the second support element and the cover element can be filled up with an adhesive. This design allows for some relaxation of manufacturing tolerances while increasing the structural integrity for the entire projection lens assembly.

In an embodiment the second support element is provided with a deflector unit for providing a deflection of the multitude of beamlets in a scanning direction. Advantageously, the deflector unit and the focusing lens electrodes only have to be aligned during construction of the projection lens assembly, not during insertion of the projection lens assembly in a lithography system, thus reducing the downtime of a lithography system when the projection lens assembly is inspected or replaced.

In an embodiment the cover element comprises a conductive material on an upstream facing surface of the cover element and a non-conductive material abutting the circumferential wall of the housing. The conductive upstream surface may be conductively connected with the deflector unit. The cover element may thus provide some shielding from external electromagnetic radiation while being electrically isolated from the circumferential wall.

In an embodiment the projection lens array further comprises a beam stop array for at least partially stopping charged particle beamlets that have been deflected by the beam blanker array from reaching the target. When the beam stop array is arranged upstream of the deflector unit, the pivot points of the charged particle beamlets for scanning movement thereof may be arranged substantially close to the image plane of the lens formed by the at least two electrodes. Alternatively, the beam stop array may be arranged between the lens and the deflector unit. The pivot points of the beamlets for scanning movement thereof may then be arranged in substantially the same plane as the beam stop array.

In an embodiment the deflector unit is adapted for deflecting a multitude of beamlets around their associated pivot points lying in substantially the same plane as the beam stop array. As a result, any scanning deflection of the charged particle beamlets by the deflector unit does not substantially change the position of the beamlet spots on the beam stop array. The apertures in the beam stop array can thus be kept small, in particular smaller than the diameter of a single beamlet. Obviously, any non-scanning deflection of a beamlet, for example by a beam blanker placed upstream of the deflector unit, will move the beamlet spot on the beam stop array to a position away from its associated aperture, preventing the beamlet from traveling past the beam stop array.

In an embodiment the at least one support element comprises a cover element with a through-opening for allowing the multitude of charged particle beamlets to pass through, wherein the housing comprises an upstream open end defined by the upstream edge, wherein the cover element is adapted for substantially covering the upstream open end of the housing wherein the first and second electrodes are comprised in beam optics, and wherein the beam optics are supported by the cover element by means of a body of an adhesive applied on a downstream facing surface of the cover element. In this embodiment a downstream part of the beam optics may be substantially free-hanging. Thus, when the beam optics are substantially vertically oriented, as is typical in charged particle beam lithography systems, there is no further need support the weight of the beam optics on a downstream part of the circumferential wall of the housing. The height of the projection lens assembly may be adjusted during construction by varying the distance between the cover element and the beam optics without having to take into account a distance between a downstream support element and the downstream distal edge of the housing.

In an embodiment the cover element, at least during construction of the lens assembly, is provided with additional through-openings for applying the adhesive to the downstream facing surface of the cover element from a location upstream of said cover element. Additionally, these through openings may further be used to reach parts of the interior of the projection lens assembly once the cover has been placed on the circumferential wall. For instance it is possible to glue the cover element to the beam optics via these through openings. Besides the additional through openings also shorten the path gas molecules have to travel when the gas is evacuated out of the interior of the projection lens assembly.

In an embodiment the height of the body of adhesive in the downstream direction is adapted to space the cover element and the second electrode apart by a predetermined distance, preferably within a range of 2 millimeters to 2 centimeters.

In an embodiment the second electrode forms a distal end of the beam optics in the downstream direction.

In an embodiment the second electrode forms a distal end of the projection lens assembly in the downstream direction. It is thus possible to place a target to be exposed to charged particle beamlets very close to the second electrode, providing a sharp focusing of said beamlets.

In an embodiment the projection lens assembly further comprises one or more positioning elements fixedly attached to said beam optics and circumferential wall in an orientation substantially perpendicular to the direction of the through opening, and adapted for positioning the beam optics at a substantially fixed distance from the circumferential wall. Though these positioning elements are generally not adapted for supporting the entire weight of the beam optics when the projection lens assembly is in a substantially vertical position of use, horizontal alignment and/or fixation of the beam optics is adequately effected by such positioning elements, providing a more robust and more accurately aligned projection lens assembly.

In an embodiment the circumferential wall comprises an electrically conductive material, providing improved electromagnetic shielding of the interior of the projection lens assembly.

In an embodiment at least one of the positioning elements is electrically conductive and conductively connects the second electrode with said circumferential wall. The housing and the second electrode may thus be kept at the same potential without the use of additional wiring. Preferably the electrically conductive positioning element or elements are attached to the beam optics and to the circumferential wall using a conductive adhesive.

In an alternative embodiment the positioning elements electrically connect another part of the beam optics, e.g. another electrode, with the circumferential wall.

In an embodiment the cover element comprises a conductive surface on an upstream facing surface of the cover element and a non-conductive material abutting the circumferential wall of the housing. The cover element thus provides some shielding from external electromagnetic radiation while being electrically isolated from the circumferential wall.

In an embodiment the downstream facing surface of the cover element comprises a conductive surface, said conductive surfaces on the upstream surface and downstream surface of the cover element connecting and extending along the one or more through openings in the cover element. The conductive surfaces further improve the electromagnetic shielding and also reduce build up of static electricity on the cover element.

In an embodiment the body of adhesive is a body of an electrically conductive adhesive conductively connecting the beam optics and the conductive surface on the downstream facing surface of the cover element. Both the upstream and downstream facing conductive surfaces of the cover element may thus be conductively connected with at least part of the beam optics without requiring an additional wire to be attached there between.

In an embodiment the cover element further comprises one or more encapsulation rings comprising an electrically insulating material, and arranged over a boundary between the conductive surface and the non-conductive material of the cover element. These encapsulation rings substantially reduce the chance of sparks occurring within the projection lens assembly.

In an embodiment the beam optics further comprise a deflector unit arranged upstream of the first electrode and adapted for providing a scanning deflection of the multitude of beamlets. Preferably the deflector unit comprises a conductive outer surface which is conductively connected to the conductive surface of the cover element to provide a high degree of electromagnetic shielding for the beamlets passing through the bream optics.

In an embodiment the beam optics further comprise a beam stop array arranged between the deflector unit and the second electrode. By placing the beam stop array relatively close to the second electrode, dispersion of the beamlets before they pass the second electrode is reduced, i.e. the beamlet profiles remain sharply defined.

In an embodiment the projection lens assembly further comprises a conductive spacer, said spacer abutting and conductively connecting the beam stop array and the first electrode. In this embodiment, the first electrode and the beam stop array are at the same potential. A voltage induced by the charged particles incident on the beam stop array or passing through said beam stop array may be measured by measuring the potential of the first electrode. Moreover, in this embodiment, acceleration of the charged particles between the beam stop array and the first electrode is avoided, as they are at the same potential.

in an embodiment the deflector unit is adapted for providing a scanning deflection for a multitude of beamlets around their associated pivot points lying in substantially the same plane as the beam stop array. In this embodiment, any scanning deflection of the charged particle beamlets does not substantially change the position of the beamlet spots on the beam stop array. The apertures in the beam stop array can thus be kept small, in particular smaller than the diameter of a single beamlet. It will be clear that any non-scanning deflection of a beamlet, for example by a beam blanker placed upstream of the deflector unit, will move the beamlet spot on the blanker array to a position away from, its associated aperture, preventing the beamlet from traveling past the beam stop array.

In an embodiment the projection lens assembly comprises a beam stop array arranged upstream of the deflector unit, and the deflector unit is adapted for deflecting a multitude of beamlets around associated pivot points lying in a plane substantially between the first and second electrodes. The beamlets may thus have their pivot points very close to a target plane while staying focused independent of the scanning deflection.

In an embodiment the body of adhesive is applied between the cover element and the next downstream structure to form a substantially ring-shaped connection there between. In a preferred embodiment this connection is air-tight.

In an embodiment the assembly is adapted to be placed and/or replaced in a lithography system as a single unit.

According to a second aspect, the present invention provides a charged particle beam lithography system for directing a multitude of charged particle beamlets onto a target, said system comprising a projection lens assembly as described herein. In particular such a system comprises a beam source arranged upstream of the projection lens assembly for providing a multitude of charged particle beamlets, and a beam blanker for providing a blanking deflection of selected beamlets of the multitude of beamlets. More in particular such a system is adapted for operating in a vacuum environment. During patterning of the target, the target and the circumferential wall are preferably kept at the same potential, for instance by conductively connecting both to earth.

According to a third aspect, the present invention provides a method for assembling a projection lens assembly for directing a multitude of charged particle beamlets onto an image plane, said projection lens assembly comprising:
  a housing comprising a circumferential wall and having an upstream, and a downstream distal edge,
  beam optics comprising a first electrode and a second electrode for focusing one or more charged particle beamlets of the multitude of charged particle beamlets, and
  a cover element,
  said housing and cover element comprising a through-opening for allowing the multitude of charged particle beamlets to pass through, and said first and second electrodes each comprising a lens-hole array for allowing one or more charged particle beamlets of the multitude of charged particle beamlets to pass through,
  wherein the cover element is adapted for substantially covering the upstream edge of the housing
  wherein said method comprises the steps of:
  aligning the beam optics with the through opening of the cover element such that the multitude of charged particle beamlets may pass through, and such that the beam optics and the cover element are spaced apart by a gap,
  fixing the cover element to the housing such that it overlaps the upstream edge of the housing.
  filling the gap between the beam optics and the cover element with a body of adhesive for substantially supportingly bonding the beam optics to the cover element, letting the body of adhesive cure.

This method of assembling a projection lens assembly allows the total height of the lens assembly to be easily adjusted without keeping a multitude of spacers with different heights at hand. Moreover, as the beam optics, which may also include a deflector unit for providing a scanning deflection of the beamlets, are substantially supportingly bonded to the cover element, construction and maintenance of the assembly is simplified; only the distance of the beam optics to the cover element has to be aligned, and as the projection lens assembly may be substantially open on the downstream side components inside the housing are easily accessed. Finally, as no additional support elements are required for supporting the beam optics on a downstream side, a lighter and more compact projection lens assembly may be manufactured.

In an embodiment the method comprises an additional step of adjusting a distance between the beam optics and the cover element while the adhesive has not yet cured. Such a distance may thus be very accurately adjusted, in a much shorter time than when using preformed solid spacers. When the cover element and the beam optics are spaced further apart during construction of the projection lens assembly, the height of the body of adhesive will increase and its width will decrease, and more adhesive may be applied to compensate for this decrease. Likewise, when the beam optics and the cover element are brought closer together, the height of the body of adhesive will decrease and its width will increase. In this case, some of the adhesive may be removed. In contrast, when only a thin sheet of adhesive is used such adjustment is not possible as such a sheet would be pulled apart when the cover element and the beam optics are moved away from each other. Preferably an adhesive is used which, when cured, has a thermal expansion coefficient similar to that of the surfaces it bonds to. The orientation of the cover element relative to the beam optics thus remains substantially constant, even when the projection lens assembly heats up or cools down. When the adhesive is a very low shrinkage adhesive, strain on the surfaces it bonds during the curing process is minimized.

In an embodiment the distance between the beam optics and the cover element is adjusted such that a distance between the second electrode and the cover element is equal to a predetermined distance. Thus projection lens assemblies of substantially equal heights may be produced, even when the height of individual beam optics may vary to some extent.

In an embodiment the method comprises, during the step of adjusting said distance, a step of directing a multitude of beamlets through the beam optics towards a beamlet profile sensor arranged in a target plane, said beamlet profile sensor being adapted for measuring a corresponding multitude of beamlet profiles, and varying said distance until an optimal measured focus for the multitude of beamlets has been reached. As long as the adhesive has not yet cured focusing and other properties of the projection lens assembly can be measured and at least partially adjusted by slightly varying the position of the beam optics relative to the cover element. Preferably, during this step, the intensity of the beamlets is less than the intensity of beamlets that would typically be used during exposure of a target.

In an embodiment the cover element comprises, at least during assembly, additional through openings arranged around the through opening, and the step of filling the gap between the beam optics and the cover element comprises injecting the adhesive through said additional through openings. The body of adhesive can thus easily be formed by applying adhesive on the cover element from various angles, as an inner side of the body of adhesive may be reached through the through opening for allowing a multitude of beamlets to pass through, and an outer side of the body of adhesive may be reached through the additional through openings. Conversely, the through openings may also be used to remove excess adhesive as long as it has not cured. After the body of adhesive has been formed the additional through openings may be closed of, for instance by filling the additional through openings with adhesive as well. Alternatively, the additional through openings may, when left open, be used to draw a vacuum within the projection lens assembly, or to circulate cleaning gases or plasma through the projection lens assembly.

In an embodiment the projection lens assembly further comprises positioning elements adapted for positioning the beam optics at predetermined distances from the circumferential wall, and the method further comprises a step of attaching the positioning elements of the beam optics and the circumferential wall. During construction and curing of the adhesive, these positioning elements help in spacing the beam optics a desired distance apart from the circumferential wall. Moreover, once the projection elements prevent a pendulum-like motion of the downstream end of the beam optics.

According to a fourth aspect the present invention provides a projection lens assembly for directing a multitude of charged particle beamlets onto an image plane, said projection lens assembly comprising a housing having a circumferential wall and being provided with an upstream and a downstream distal edge, a first electrode and a second electrode for focusing one or more of the multitude of charged particle beamlets, and a support element comprising a non-conductive material, said housing and support element comprising a through-opening for allowing the multitude of charged particle beams to pass through, and said first and second electrodes each comprising a lens hole-array aligned with the through-opening for allowing one or more charged particle beamlets from the multitude of charged particle beamlets to pass through, wherein the support element is attached to the downstream distal edge of the housing, with the second electrode forming a distal end of the projection lens assembly in the downstream direction, and the first electrode being spaced apart from said circumferential wall, the support element bridging the distance between the first electrode and the circumferential wall.

In an embodiment the first electrode and second electrode are supported by the support element and arranged on or near the support element. Thus, both electrodes may be arranged downstream of the support element.

In a preferred embodiment the first and second electrodes are arranged on the upstream surface and the downstream surface of the support element respectively. Thus the first electrode is protected from damage by the housing and the support element.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 2A shows a cross sectional view of an embodiment of the projection lens assembly according to the invention, FIG. 2B shows an enlargement of portion 260 of FIG. 2, FIG. 3 shows a schematic diagram of an alternative electrode arrangement of a projection lens assembly according to the present invention.

FIGS. 8A, 8B and 8C show a schematic cross-sectional view, a top view and a bottom view respectively of a further embodiment of a projection lens assembly according to the present invention.

DETAILED DESCRIPTION OF THE INVENTION

Figure 1A:
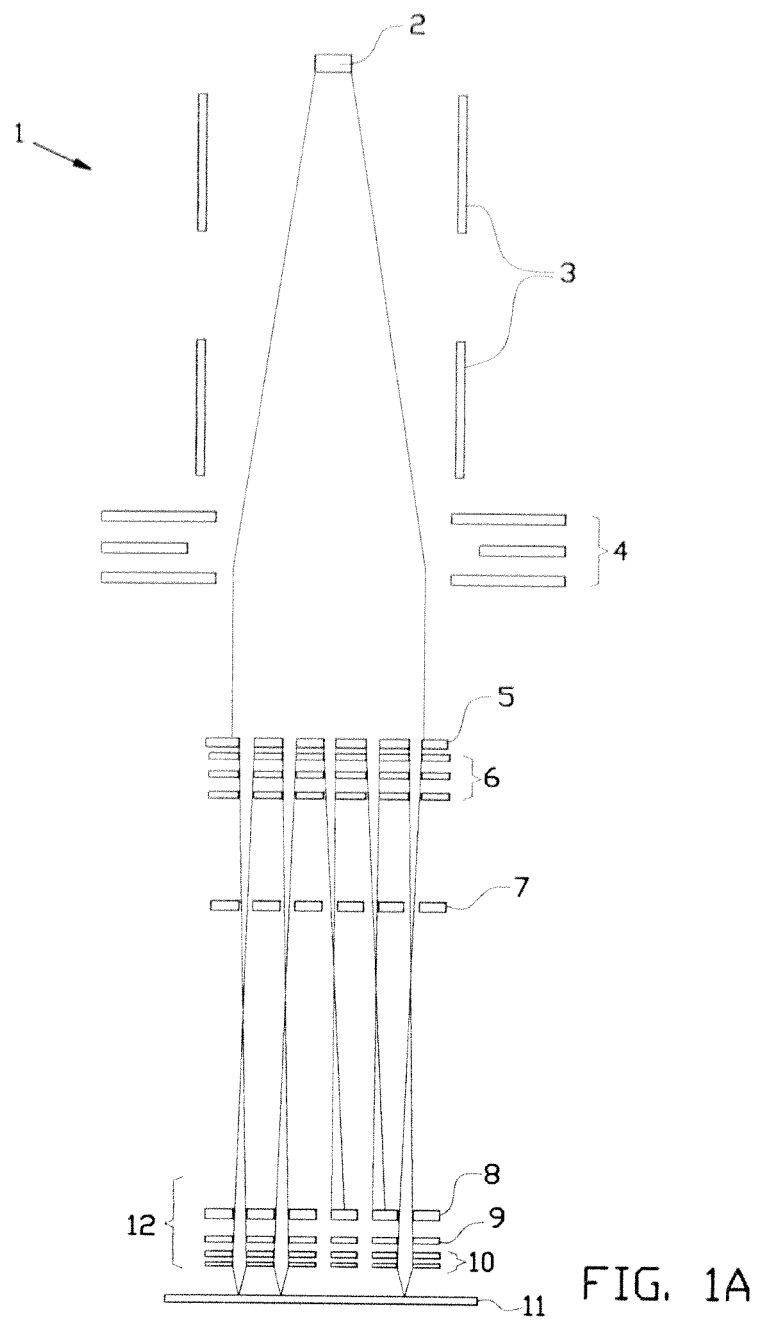
FIG. 1A shows a schematic diagram of a prior art charged particle exposure system.

An optical column 1 as known from the prior art is shown in FIG. 1A. A charged particle beam source 2 emits a charged particle beam which traverses a double octopole 3 and collimator lens 4 before impinging on an aperture array 5. The aperture array then splits the beam into a multitude of charged particle beamlets which are condensed by condenser array 6. At beam blanker array 7 individual beamlets may be blanked, i.e. may be deflected such that they encounter beam stop array 8 later on in their trajectories instead of passing through apertures in beam stop array 8. The beamlets that have not been blanked then pass through a deflector unit 9 which is adapted to provide a scanning deflection of said beamlets in the X- and Y-directions. The deflector unit is typically a macro deflector comprising a conductive material extending over its outer surface. At the end of their trajectories the beamlets that have not been blanked pass through a lens array 10 adapted for focusing said beamlets onto a surface of a target 11. The beam stop array 8, deflector unit 9 and lens array 10 together comprise projection lens assembly 12 which provides blocking of blanked beamlets, scanning deflection of the multitude of beamlets, and demagnification of unblanked beamlets.

Figure 1B:
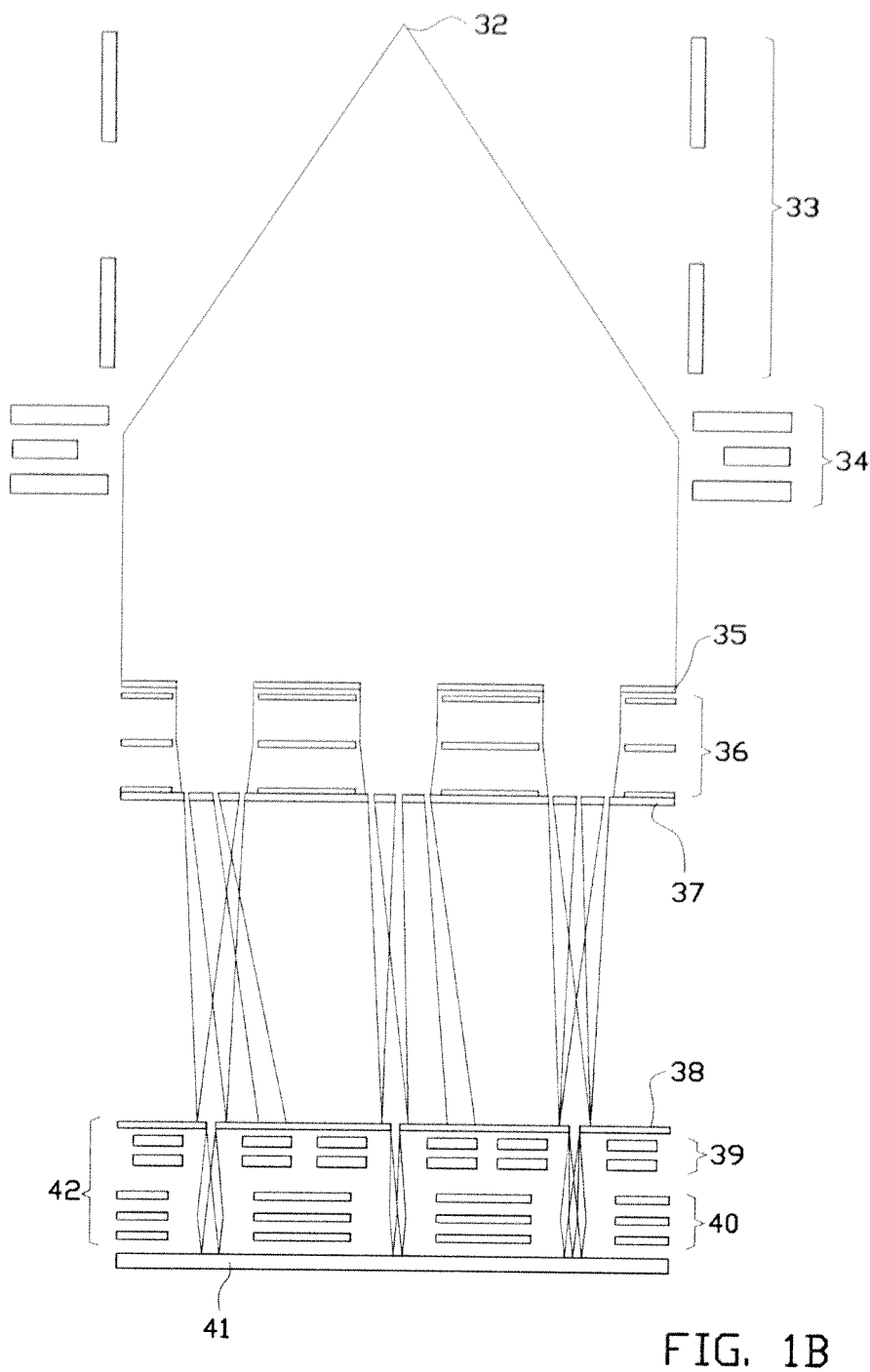
FIGS. 1B and 1C, show a schematic diagram of an alternative charged particle exposure system, and a detail thereof.

FIG. 1B shows an alternative optical column 31. A charged particle beam source 32 emits a charged particle beam which traverses a double octopole 33 and collimator lens 34 before impinging on an aperture array 35. The aperture array then splits the beam into a plurality of charged particle subbeams which are condensed by condenser array 36. At beam blanker array 37 the subbeams are split into a multitude of beamlets.

The individual beamlets may be blanked, i.e. may be deflected such that they encounter beam stop array 38 later on in their trajectories instead of passing through apertures in beam stop array 38. The beamlets that have not been blanked then pass through a deflector unit 39 which is adapted to provide a scanning deflection of said beamlets in the X- and/or Y-direction. The deflector unit typically comprises micro-electro mechanical system (MEMS) elements adapted for provided scanning deflection of groups of said beamlets. At the end of their trajectories the beamlets that have not been blanked pass through a lens array 40 adapted for focusing said beamlets onto a surface of a target 41. The beam stop array 38, deflector unit 39 and lens array 40 together comprise projection lens assembly 42 which provides blocking of blanked beamlets, scanning deflection of the multitude of beamlets, and demagnification of unblanked beamlets.

Figure 1C:
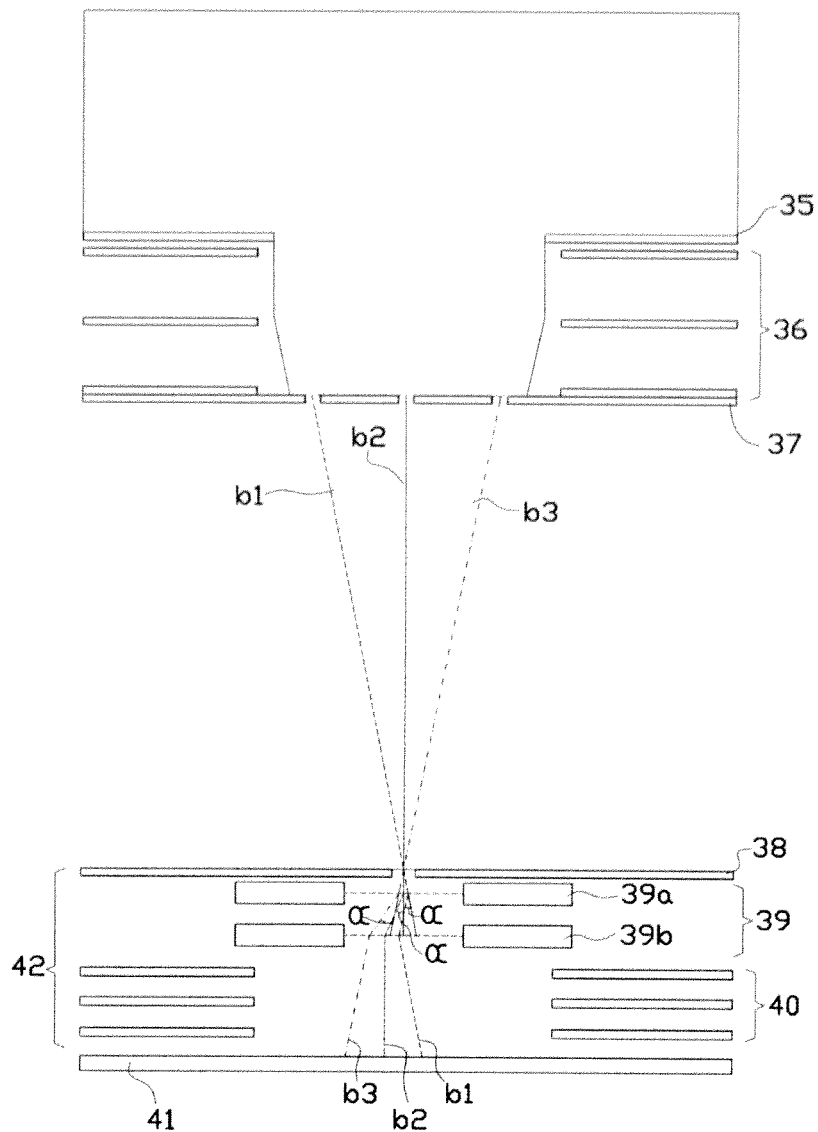

FIG. 1C schematically shows a detail of an optical column as shown in FIG. 1B, showing trajectories of three beamlets b1,b2,b3. A subbeam of a beam from a charged particle beam source emerges from aperture array 35 and is condensed by condenser array 36. The subbeam is subsequently split up into beamlets b1,b2,b3 at beam blanker array 37, which is adapted for providing a blanking deflection to the individual beamlets. In the figure shown, none of the beamlets b1,b2,b3 is provided with a blanking deflection, so that said beamlets pass through a common aperture in beam stop array 38. The unblanked beamlets are then provided with a scanning deflection by deflector unit 39, which comprises MEMS elements 39a and 39b adapted, for providing a scanning deflection to the plurality of beamlets. At the end of their trajectories the beamlets that have not been blanked pass through a lens array 40 adapted for focusing said beamlets onto a surface of a target 41. The beam stop array 38, deflector unit 39 and lens array 40 together comprise a projection lens assembly 42 which provides blocking of blanked beamlets, scanning deflection of the multitude of beamlets, and demagnification of unblanked beamlets.

FIG. 2A shows a cross sectional view of an embodiment of an improved projection lens assembly 200 according to the invention. The embodiment shown comprises a housing having an electrically conductive circumferential wall 230, preferably metallic. The projection lens assembly further comprises a cover element 210, and a support element 240 at the downstream end of said housing. A through-opening 213 for the passage of charged particle beamlets extends from the upstream surface of the cover element 210, through the interior of the projection lens assembly towards the first electrode 201, through the support element 240 and finally debouches in second electrode 202. A multitude of charged particle beamlets may traverse said through-opening before impinging on a target 270. In the embodiment shown, the support element extends parallel to both the first and the second electrode. Preferably, the support element extends radially away from the lens-hole arrays in first and second electrodes.

To avoid formation of electrical fields between the target and the projection lens assembly, both may be connected to ground and/pr conductively connected to each other. A structurally robust projection lens assembly according to the invention may be placed integrally in a known lithography system or may be swapped out or removed for maintenance purposes.

The multitude of charged particle beamlets first passes through the through passage 213 in the cover element 210. The main body of the cover element 210 is made from a non-conductive material, though its upstream surface comprises a conductive coating 211, and a portion of its downstream surface comprises another conductive coating 212, which both serve to shield the inside of the lens assembly from external electromagnetic influences. Preferably the two conductive coatings are joined at the sides of the through opening, forming a single contiguous surface. Encapsulation rings 251 and 252, made from a non-conductive, preferably ceramic material, encapsulate corners between the coatings and cover element 210, in order to reduce the chance of sparks forming at those corners.

Once the charged particle beamlets have traversed the through opening they pass through a deflector unit 220 which is adapted to provide scanning deflection of a multitude of beamlets. The deflector unit may deflect the charged particle beamlets any number of times using a corresponding number of deflectors. In a preferred embodiment the deflector unit comprises an X- and a Y-deflector. Leads 224a and 224b, preferably triaxial leads, at base 222 of the deflector unit are adapted for carrying control signals indicating whether the deflector unit is functioning properly. The deflector unit is substantially supported by the support element 240, yet preferably also attached through a conductive adhesive connection 221 to cover element 210. The deflector unit thus acts a second support element which interconnects the cover element with support element 240, thereby increasing the structural robustness of the assembly. Advantageously, a conductive adhesive is applied to facilitate construction of the projection lens assembly, i.e. to allow for widening of tolerances, thereby reducing cots and effort in manufacture of elements on the one hand, as well as of the assembly thereof on the other hand. According to insight underlying the present invention in this respect, slight variations in distance between the downstream facing conductive coating 212 of cover element 210 and the deflector unit 220 are compensated for by filling the gap with more or a lesser amount of conductive adhesive. In a preferred embodiment, the adhesive is of a type which, once cured, has a very low volatility in a vacuum and a thermal expansion coefficient corresponding, if not similar to the surfaces it bonds. The base 222 of the deflector unit is mounted on an insulator 223 which electrically insulates the deflector unit from first electrode 201. Both the first and second electrodes 201,202 comprise a lens hole-array, each lens hole corresponding to a charged particle beamlet that might pass through it.

The support element 240 comprises a layer 232 of a non-conducting material, a first conductive coating 241 on an upstream facing surface of the support element, and a second conductive coating 242 on an downstream facing surface of the support element. The first and second conductive coatings are electrically isolated from each other. The first electrode 201 is conductively connected to the first conductive coating 241 on the upstream facing surface of the support element. Leads 209a and 209b, which are attached to the first coating, are adapted for providing an electrical signal to the first electrode, preferably such that a potential difference between the first and second electrodes which generates a field for focusing charged particle beamlets, wherein the potential difference between said electrodes is in the range of 4 kV. Second electrode 202, which is arranged on the downstream facing surface of support element 240, is conductively connected to said second conductive coating 242 which preferably covers all or most of said downstream facing surface. In a preferred embodiment, the second coating extends across the outer edge of the support element and is in conductive contact with the circumferential wall 230 of the housing. The circumferential wall and first coating are thus adapted to provide at least partial electromagnetic shielding of the interior of the lens assembly.

Advantageously, the insulating layer 243 preferably comprising borosilicate glass, of the support element is strong enough to substantially support the weight of the deflector unit, yet thin enough to allow strong and uniform electrical fields to be generated between the first and second electrodes.

FIG. 2B shows a magnified view of portion 260 of FIG. 2A. It can clearly be seen that the first and second coatings 241, 242 which have been deposited on insulating layer 243, are electrically isolated from each other by the insulating layer and by gap 244a. The gap 244a is filled with a non-conductive adhesive. Preferably the adhesives used in the projection lens assembly have low thermal expansion coefficients. To prevent sparks from occurring at corners of the first and second coatings, dielectric breakdown protection structure 253 has been placed at point of contact between the circumferential wall 230 and the support element 240. A small recess 246 in the insulating layer 243 at the through-opening of the support element 240 serves to prevent sparks from occurring between the first and second electrodes and their corresponding coatings near the through-opening.

Figure 2C:
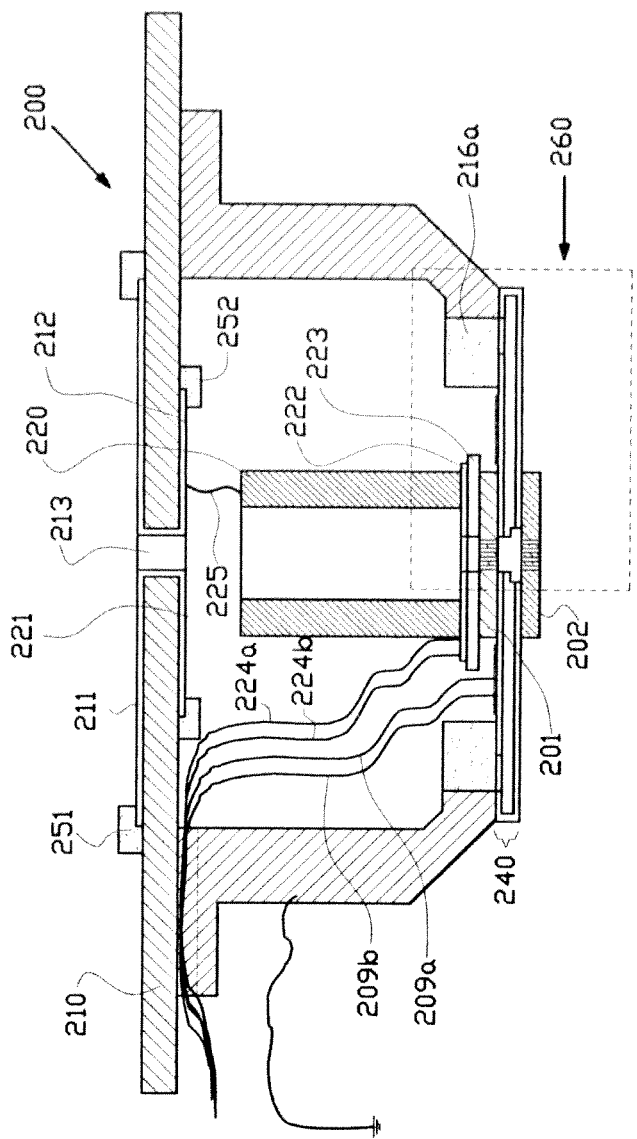
FIG. 2C shows a cross sectional view of an alternative embodiment of the projection lens assembly.

FIG. 2C shows an alternative embodiment of a projection lens in which the weight of the deflector unit 220 is substantially completely supported by the support element 240, i.e. the deflector unit is not supportingly connected to the cover element 210. Isolated electrical lead 225, preferably attached to the deflector unit by means of a detachable connector, conductively connects the outer surface of the deflector unit to the downstream facing conductive coating of the cover element, ensuring that these have substantially the same potential. In this embodiment, the cover element is removably attached to the circumferential wall 230. In another embodiment lead 225 passes through the circumferential wall to connect with the upstream facing surface of the cover element.

Figure 2D:
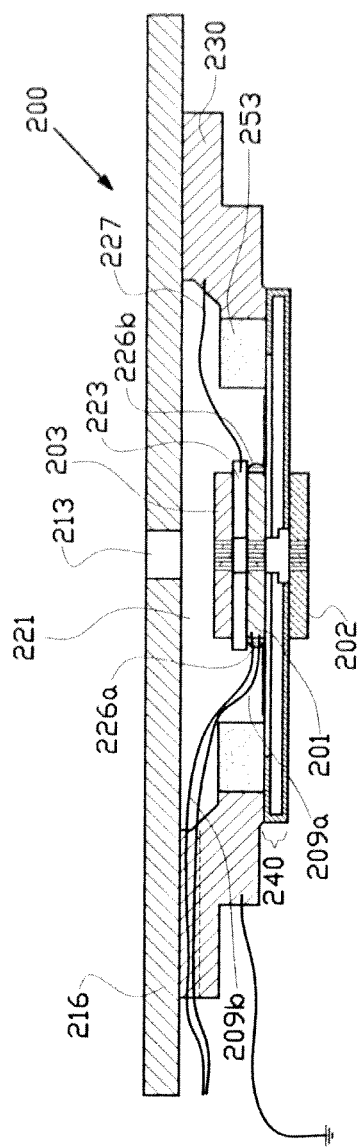
FIG. 2D shows a cross sectional view of an further alternative embodiment of the projection lens assembly.

FIG. 2D shows an alternative embodiment of a projection lens assembly according to the invention. The second electrode 202 and the third electrode 203 are electrically connected to the housing and substantially at ground potential. The first electrode 201 is electrically insulated from the second electrode 202 by support element 240, and electrically insulated from the third electrode 203 by insulator 223. Leads 209a and 209b are attached to the first electrode 201 for providing an electrical signal to first electrode such that an electrical field is generated between the first and second electrode and between the first and third electrode, for focusing charged particle beamlets. Typically, the potential difference between said the first electrode 201 and the second and third electrodes 202,203 in this embodiment is in the range of −3.4 kV. The outer edges of first electrode 201 are encapsulated by bodies of a non-conductive adhesive, for preventing the forming of sparks at the outer edges of the first electrode 201.

FIG. 3 shows a schematic diagram of a section of an alternative projection lens assembly according to the invention. The projection lens assembly is constructed in a manner similar to the projection lens assembly shown in FIG. 2, and comprises, besides first electrode 301 and a second electrode 302, a third electrode 303 arranged upstream of the first electrode 301. Support element 340 has been reinforced with strips of glue 345 which are deposited on first conductive coating 341. Preferably, neighboring elements are bonded to each other using suitable adhesives.

The third and first electrodes 303,301 are spaced apart and electrically isolated from each other by insulating spacer 324. The third electrode is conductively connected to the outer surface of the deflector unit 320, through conductive beam stop array 322 and conductive spacer 323. The outer surface of the deflector unit 320, and therefore the third electrode 303 as well, is preferably kept at a constant potential, for example at −4 kV with respect to ground. The second electrode 302 is again conductively connected to the circumferential wall (not shown) through second conductive coating 342. Preferably the circumferential wall and second electrode 302 are kept at the same substantially constant potential as the target to be patterned, typically at ground potential. By varying the potential of the first electrode 301, the electrical fields between the first electrode and the third electrode 303 can be varied, as well as the electrical field between the first electrode 301 and the second electrode 302. The potential of the first electrode may typically be varied in the range of −4.3 kV. In this manner an array of electrostatic lenses is formed, capable of generating adaptable electrical fields for focusing a multitude of charged particle beamlets.

In an alternative embodiment, the third electrode and the second electrode are kept substantially at ground potential, and the first electrode is kept at a substantially constant potential, for example at −3.4 kV with respect to the third electrode and the second electrode. In this embodiment the insulating spacer 324 with electrically insulates the first electrode and third electrode from each other is preferably formed by applying an electrically insulating adhesive between the first electrode and the third electrode.

Figure 4A:
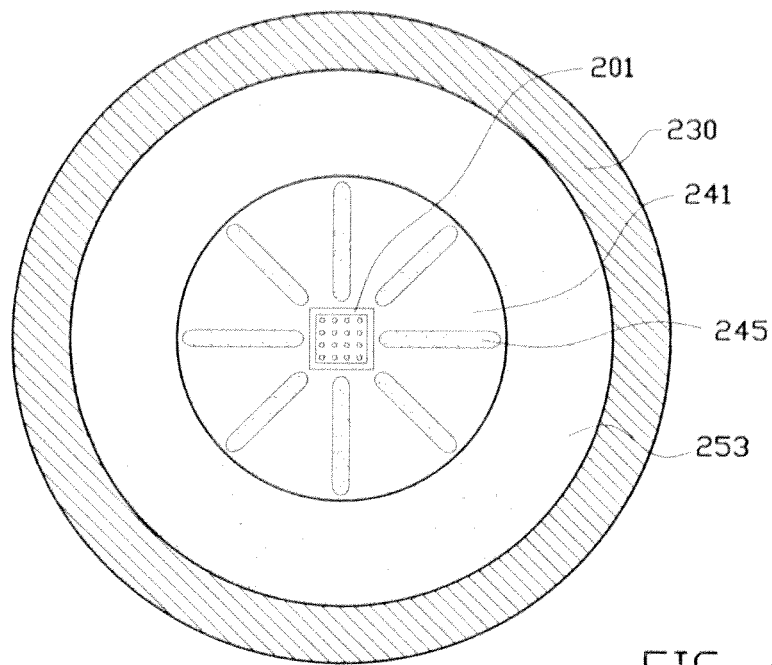
FIGS. 4A and 4B show a cross-sectional view along line A-A of FIG. 2B and a top view of the projection lens assembly respectively.

FIG. 4A shows a cross-sectional view of the projection lens assembly of FIG. 2B along the line A-A. The support element 240, which extends radially away from the lens-hole arrays of first electrode 201 and second electrode 202 (not shown), comprises a first conductive coating 241 on its upstream surface. Circumferential wall 230 and dielectric projection structure 253 are shown in greater detail as well. The upstream surface of the support element 240 is provided with radially extending strips 245 of adhesive which further increase the supporting capacity of the support element. In case strips of, preferably non-conductive, adhesive are provided on the downstream facing surface of the support element, care must be taken that the ridges of the strips do not project past the second electrode in the downstream direction. The second electrode may then still be placed very close to the target.

Figure 4B:
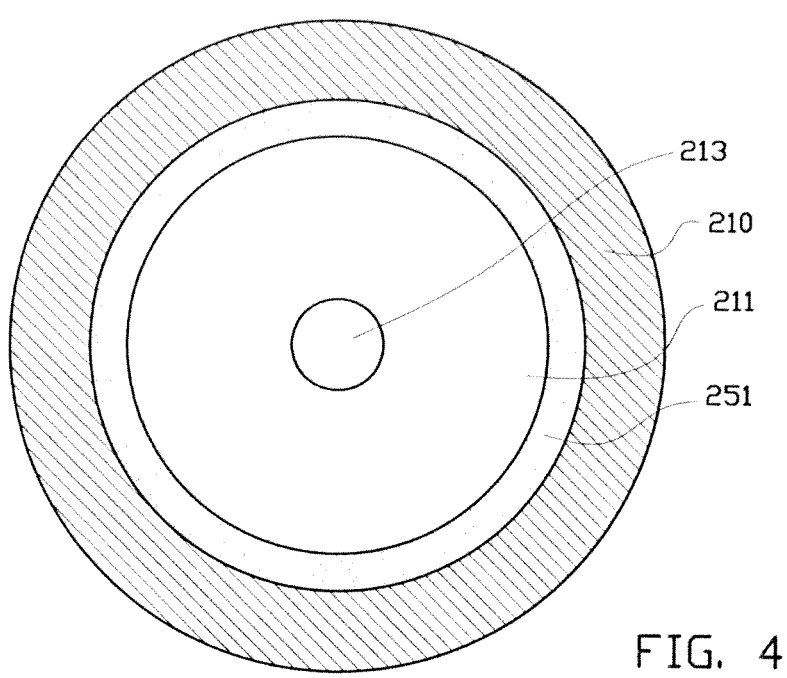

FIG. 4B shows a top view of the projection lens assembly of FIG. 2A, in which the through-opening 213 for the multitude of beamlets, dielectric breakdown protection ring 251 and upstream facing conductive coating 211 of the cover element 210 are visible. The ring 251, preferably comprising a non-conductive ceramic material, encapsulates the outer edge of the upstream facing conductive coating 211 to prevent sparks from forming at that edge.

Figure 5A:
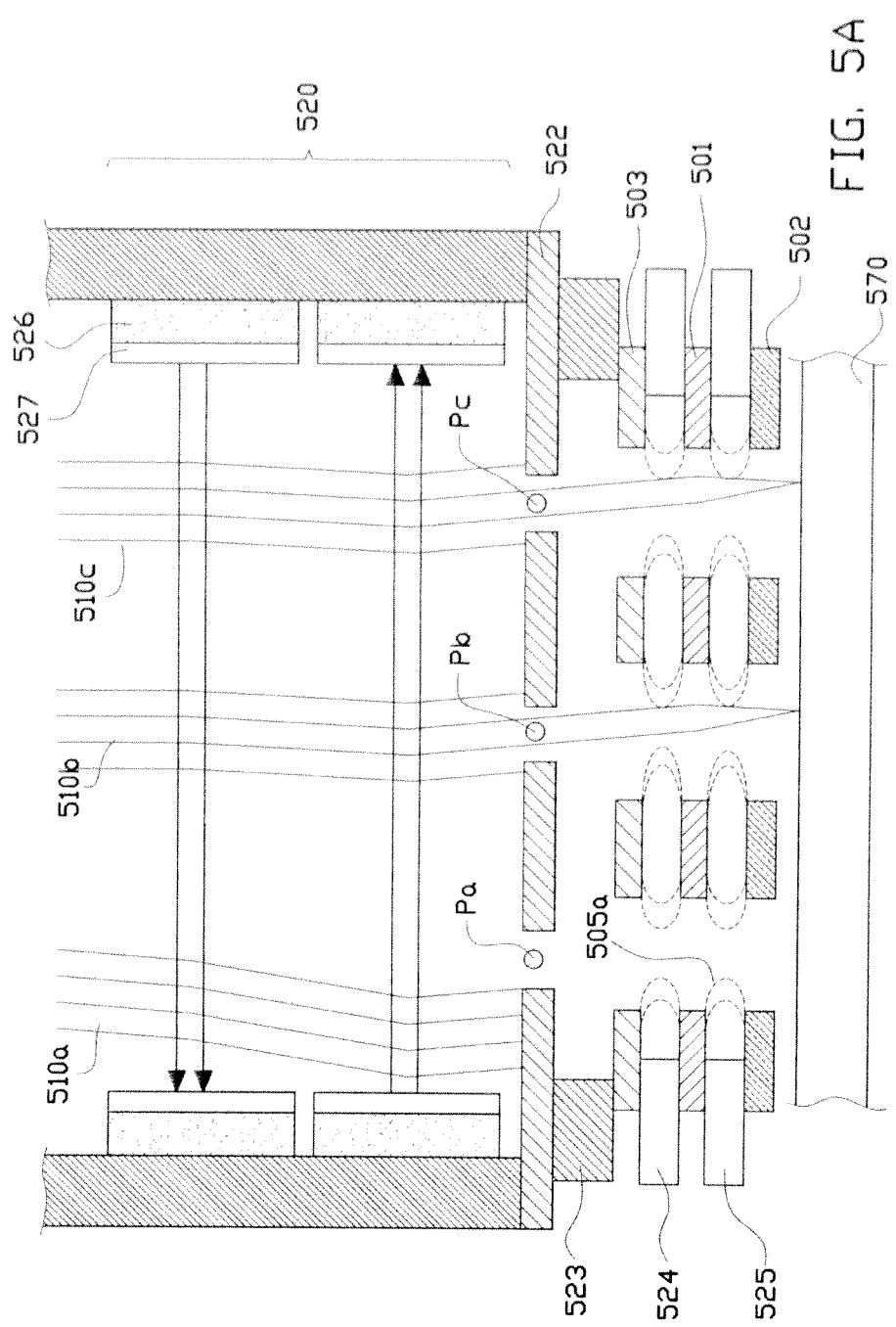
FIG. 5A shows a cross sectional schematic diagram of a projection lens assembly according to the invention with its beam stop arranged between the deflector unit and the electrodes.

A schematic diagram of charged particle beamlet trajectories in an embodiment of the projection lens assembly according to the invention is given in FIG. 5A. In this embodiment a beam stop array 522 has been arranged between deflector unit 520 and third electrode 503. Beamlets 510a, 510b and 510c pass through deflector unit 520 which is adapted to provide a scanning deflection of said beamlets in the X- and/or Y-directions. Enveloped by the conductive outer surface of the deflector unit 520, are deflector plates 527 which are electrically isolated from the outer surface of the deflector unit by spacers comprising an isolating material 526.

Before reaching the deflector unit, beamlet 510a has been given a blanking deflection, and is therefore directed onto a non-beamlet passing region of beam stop array 522. The unblanked beamlets 510b and 510c traverse the deflector unit, and are deflected about their corresponding pivot points Pb and Pc which are located in substantially the same plane as beam stop array 522. As the pivot point of each beamlet is in substantially the same plane as the beam stop array, unblanked beam spots do not move on the beam stop array, i.e. the deflection by the deflector unit does not substantially influence the intensity distribution of unblanked beamlets at their corresponding pivot points. Unblanked beamlets 510b and 510c then pass the lens holes in the first and second electrodes 501, 502, between which electric fields 505a are generated which are adapted to focus the charged particle beamlets onto a target 570. The electrodes are spaced apart by spacers 523, 524 and 525. Because the beam stop array and the pivot points of the beamlets in this arrangement may be positioned relatively close to the lens electrodes, in particular closer to the principal plane of the lens electrodes than if the beam stop array were placed upstream of the deflector unit, beamlet aberration is significantly reduced. This results in more sharply defined beamlet spots on the target and allows patterning of the target at higher resolutions.

Figure 5B:
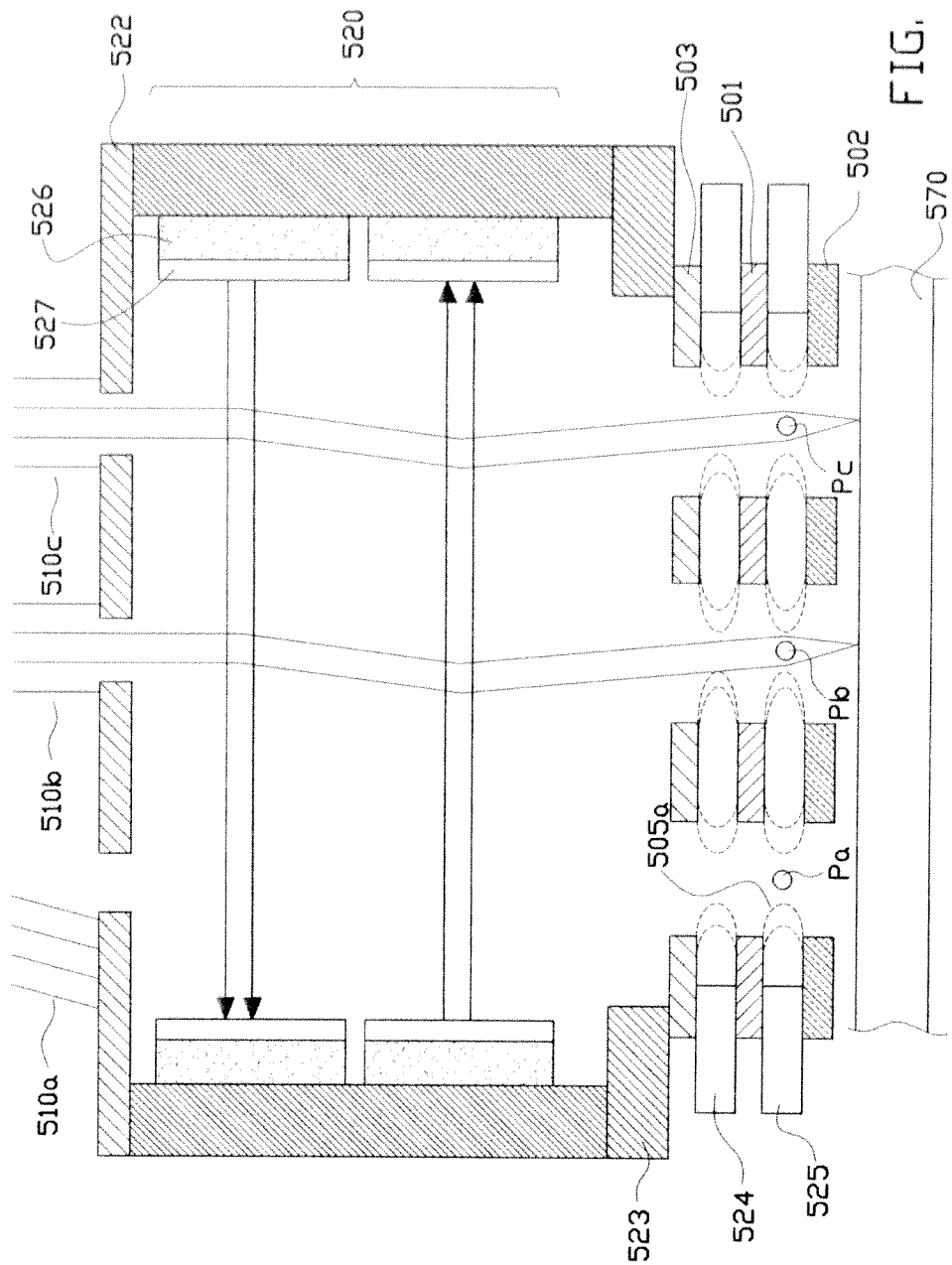
FIG. 5B shows a cross sectional schematic diagram of a projection lens assembly according to the invention with its beam stop arranged upstream of the deflector unit.

FIG. 5B shows an alternative embodiment of a projection lens assembly according to the invention, wherein the beam stop array 522 is arranged upstream of the deflector unit 520. Charged particle beamlet 510a has been given a blanking deflection before reaching the beam stop array and therefore impinges on a non-beamlet passing region thereof. Charged particle beamlets 510b and 510c pass the beam stop array 522 and are given a scanning deflection by deflector unit 520. The beamlets are then focused using electrodes 501,502,503 before striking the target 570. Because the second electrode 502 forms the downstream distal end of the projection lens assembly, the charged particle beamlets may have their pivot points positioned very close to the target 570 while staying focused substantially independent of the scanning deflection.

Figure 6:
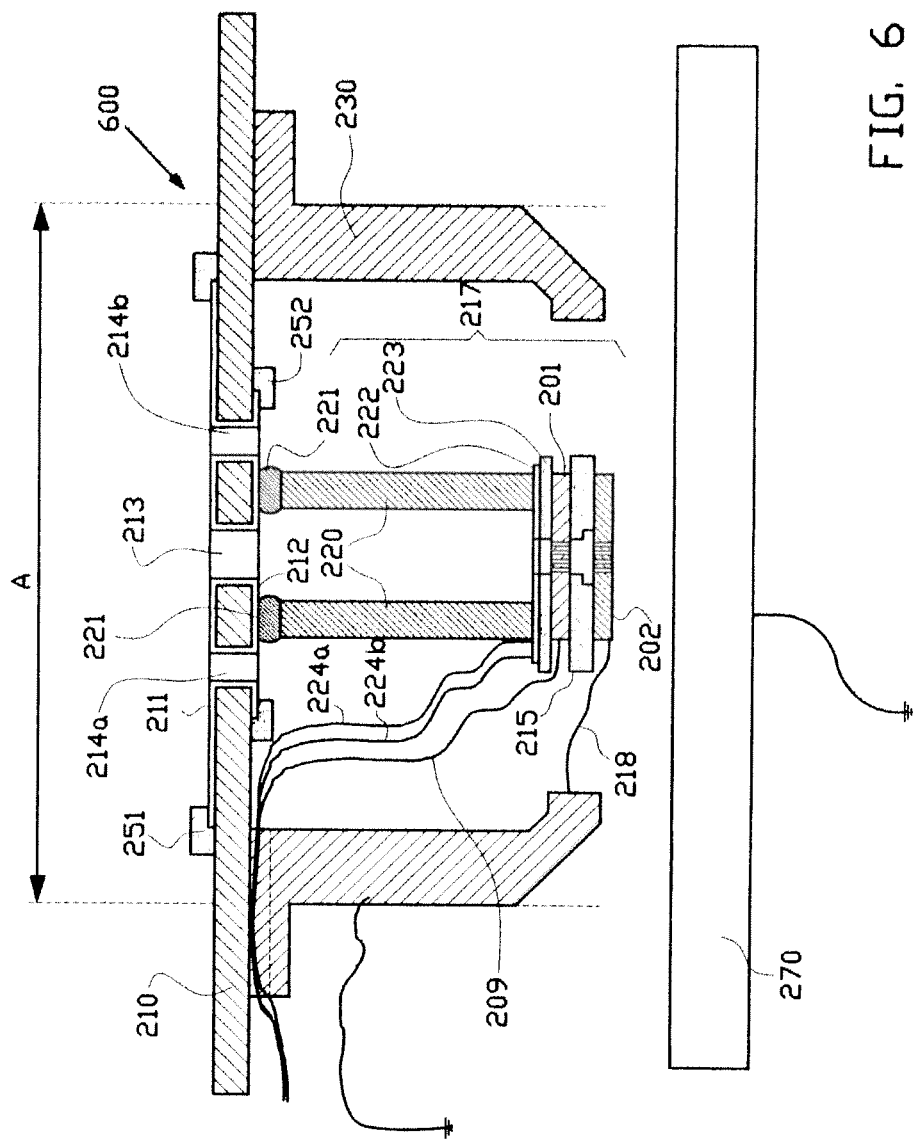
FIG. 6 shows a schematic cross-sectional view of an embodiment of a projection lens assembly according to a further embodiment of the present invention.

FIG. 6 shows an embodiment of an improved projection lens assembly 600 according to the invention. The embodiment shown comprises a housing having an electrically conductive circumferential wall 230, preferably metallic. The projection lens assembly further comprises a cover element 210 substantially covering an opening at the upstream end of said housing. A through-opening 213 for the passage of charged particle beamlets extends from the upstream surface of the cover element 210, through the interior of the projection lens assembly towards the first electrode 201, through non-conductive spacer 215, and finally debouches in second electrode 202. A multitude of charged particle beamlets may traverse said through opening before impinging on a target 270.

To avoid formation of electrical fields between the target and the projection lens assembly, both may be connected to ground and/or conductively connected to each other. A projection lens assembly according to the invention may be placed integrally in a known lithography system or may be swapped out or removed for maintenance purposes.

The multitude of charged particle beamlets first passes through the through passage 213 in the cover element 210. The main body of the cover element 210 is made from a non-conductive material, though its upstream surface comprises a conductive surface 211, and a portion of its downstream surface comprises another conductive surface 212, which both serve to shield the inside of the lens assembly from external electromagnetic influences. Preferably the two conductive surfaces join at the sides of the through opening, forming a single contiguous surface. Encapsulation rings 231 and 252, made from a non-corners between the conductive surfaces and cover element 210, in order to reduce the chance of sparks forming at those corners.

Once the charged particle beamlets have traversed the through-opening of the cover element, they pass through beam optics 217 which directs the multitude of beamlets onto target 270. In the embodiment shown the beam optics comprise a scanning deflector unit 220 mounted at its base 222 on a non-conductive spacer 223, and further comprise first electrode 201, non-conductive spacer 215 and second electrode 202. Deflector unit 220 is adapted for providing a scanning deflection of the multitude of beamlets. The deflector unit may deflect the charged particle beamlets any number of times using a corresponding number of deflectors. In a preferred embodiment the deflector unit comprises an X- and a Y-deflector. Leads 224a and 224b, preferably triaxial leads, at base 222 of the deflector unit are adapted for carrying control signals indicating whether the deflector unit is functioning properly. The beam optics are substantially supported by the cover element 210 and attached thereto through a conductive adhesive connection 221. According to insight underlying the present invention in this respect, variations in distance between the downstream facing conductive surface 212 of cover element 210 and the deflector unit 220 may be compensated for during construction of the projection lens assembly, by adjusting the height of the body of conductive adhesive 221 which fills the gap. In a preferred embodiment, the adhesive is of a type which, once cured, has a very low volatility in a vacuum and a thermal expansion coefficient corresponding, if not similar to the surfaces it bonds. The base 222 of the deflector unit is mounted on an insulator 223 which electrically insulates the deflector unit from first electrode 201. Both the first and second electrodes 201,202 comprise a lens-hole array, each hole of said array corresponding to a charged particle beamlet that might pass through it.

Lead 209, is attached to the first electrode 201 and adapted for providing an electrical signal hereto, preferably such that a potential difference between the first and second electrodes 201,202 which generates a field for focusing charged particle beamlets, is in the range of 4 kV. Second electrode 202, which is arranged on the downstream facing surface of positioning element 240, is conductively connected to the circumferential wall 230 by means of conductive wire 218.

Typically the height of the beam optics, in this case the distance from the downstream distal end of the second lens array 202 to the upstream distal end of the deflector unit 220, can not be adjusted once the beam optics have been assembled. According to the method of the present invention, the total distance from the distal edge of the second electrode to the upstream surface of the cover element may however quite easily be adjusted by varying the height of the body of adhesive 221 which bonds the two together. Additional through openings 214a, 214b in the cover element 210 may be used during construction of the projection lens assembly to inject adhesive through to fill a gap between the beam optics and the cover element.

Figure 7:
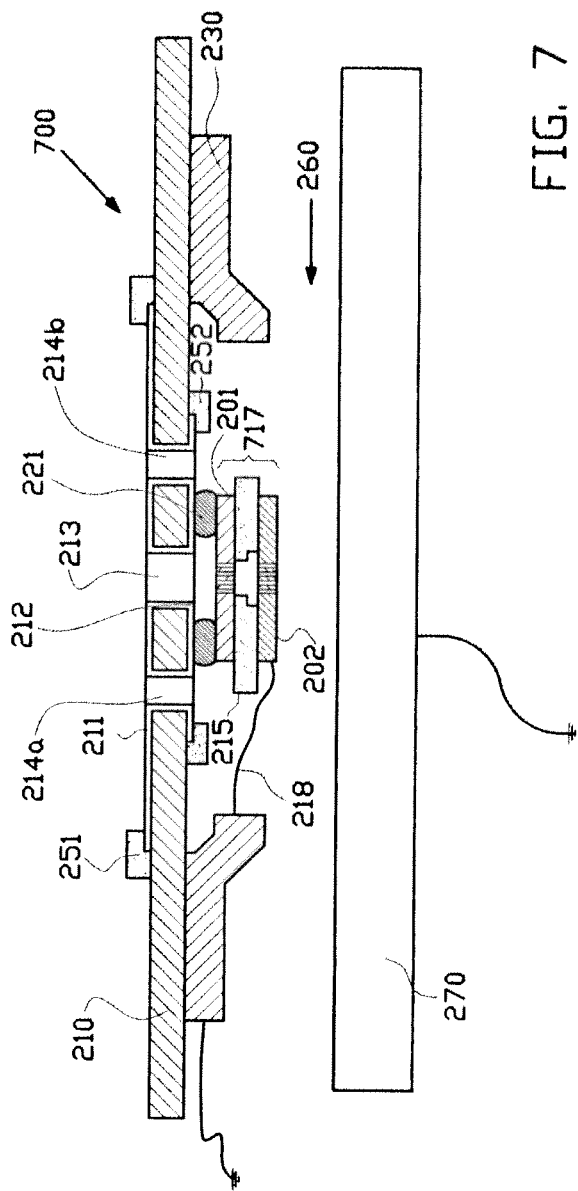
FIG. 7 shows a schematic cross-sectional view of a further embodiment of a projection lens assembly according to the present invention.

FIG. 7 shows an alternative embodiment of a projection lens assembly 700 according to the invention. In this embodiment the beam optics 717 do not comprise a deflector unit for providing a scanning deflection of the multitude of charged particle beamlets. A deflector unit may be placed upstream of the projection lens assembly in a lithography system. The beam optics 717 comprise a first electrode 201 and a second electrode 202, spaced apart by a non-conductive spacer 215 which also forms part of the beam optics. The first electrode 201 is conductively connected to a downstream facing surface of the cover element 210. The connection between the downstream facing surface, which comprises conductive surface 212, and the first electrode, is formed by a body of conductive adhesive 221. Lead 218 electrically connects the second electrode 202 with the circumferential wall 120, such that both are a ground potential. Especially when the electrodes are thin and electric field, the height of the body of adhesive is an important factor in the height of the entire projection lens assembly. During construction of the projection lens assembly, this height may conveniently be adjusted to a desired height by varying the height of the body of adhesive.

FIG. 8A shows an alternative embodiment of a projection lens assembly similar to that shown in FIG. 6, further comprising positioning elements 249a, 249b. Near the downstream opening of the housing the beam optics are aligned substantially perpendicular to the direction of the through opening by means of these positioning elements 249a, 249b. Besides providing additional stability in the position of the beam optics relative to the housing, the positioning elements may also facilitate construction of the projection lens assembly, i.e. simplify alignment of the beam optics perpendicular to the direction of the through opening. In this embodiment the positioning elements comprise elongated, thin and substantially rigid structures, and are preferably attached to the circumferential wall 230 and to the beam optics 217 using an electrically conductive adhesive. In the embodiment shown, the positioning elements comprise an electrically conductive material and are attached to the second electrode 202 and to the circumferential wall 230 thus keeping these at the same potential. The positioning elements 249a, 249b keep the distance between the otherwise free hanging distal end of the beam optics and the circumferential wall substantially constant, increasing the structural integrity of the projection lens assembly and restraining translational and/or oscillating movement of the second electrode 202 relative to the circumferential wall. In an alternative embodiment, the positioning projection lens assembly, and are not present in the finished product.

Figure 8B:
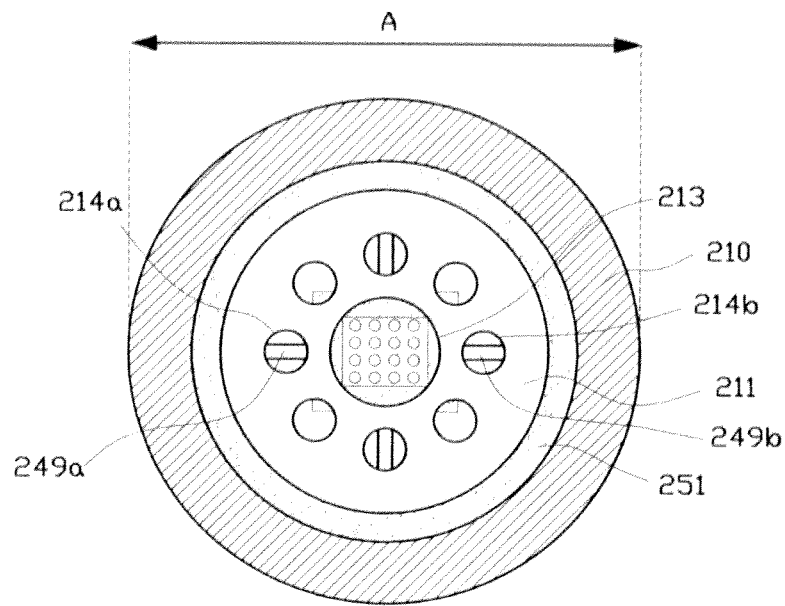

FIG. 8B shows a top view of the projection lens assembly of FIG. 6 along a section indicated by line A, i.e. not showing the outermost peripheral area of cover element 210. Moving in a direction radially outward from through opening 213 of said cover element 210, an upstream facing conductive surface 211 can be seen surrounding additional through openings 214a, 214b. The additional through openings are arranged around through opening 213 and facilitate passage of an injection needle or the like for depositing a body of adhesive between the downstream facing surface of the cover element and an upstream facing surface of the beam optics. Moving further outward, an edge between upstream facing conductive surface 211 and a non-conductive portion of cover element 210 is encapsulated by encapsulation ring 251 comprised of a non-conductive material, to reduce the chance of sparks occurring at that edge.

Figure 8C:
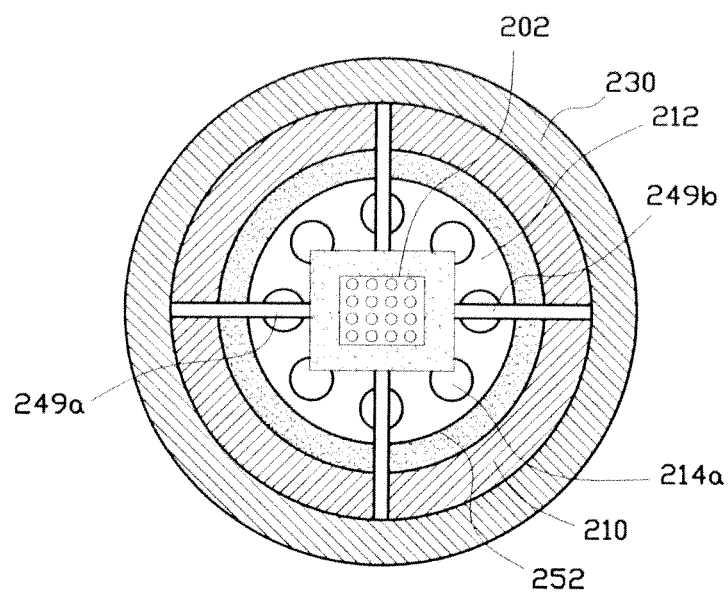

FIG. 8C shows a bottom view of the projection lens assembly of FIG. 6, along the section indicated by line A. Second electrode 202 is electrically connected to circumferential wall 230 by positioning elements 249a,249b. Behind second electrode 202, part of non-conductive spacer 215 can be seen, as can parts of the additional, through openings 214a, 214b. These additional through openings debouch in a conductive surface 212 of the cover element 210, said material enhancing the electromagnetic shielding properties of the projection lens assembly. An edge between conductive surface 212 and a non-conductive portion of the cover element 210 is encapsulated by encapsulation ring 252, to prevent sparks from occurring at that edge. Positioning elements 249a,245b extend substantially perpendicular to the direction of the through opening 213, and are adapted to substantially fix the position of the beam optics along the plane which they span. In other words, when the second electrode 202 and the positioning elements 249a,249b are oriented horizontally, the positioning elements substantially constrain horizontal movement of the beam optics relative to the circumferential wall. As the positioning elements limit movement along the direction in which the extend, small adjustments in distance between the beam optics and the cover element can be made even when the positioning elements have already circumferential wall. In an alternative embodiment, the positioning element may be formed by a membrane which is fixedly attached to the beam optics and to the circumferential wall in an orientation substantially perpendicular to the direction of the through opening, and adapted for positioning the beam optics at a substantially fixed distance from the circumferential wall.

Figure 9:
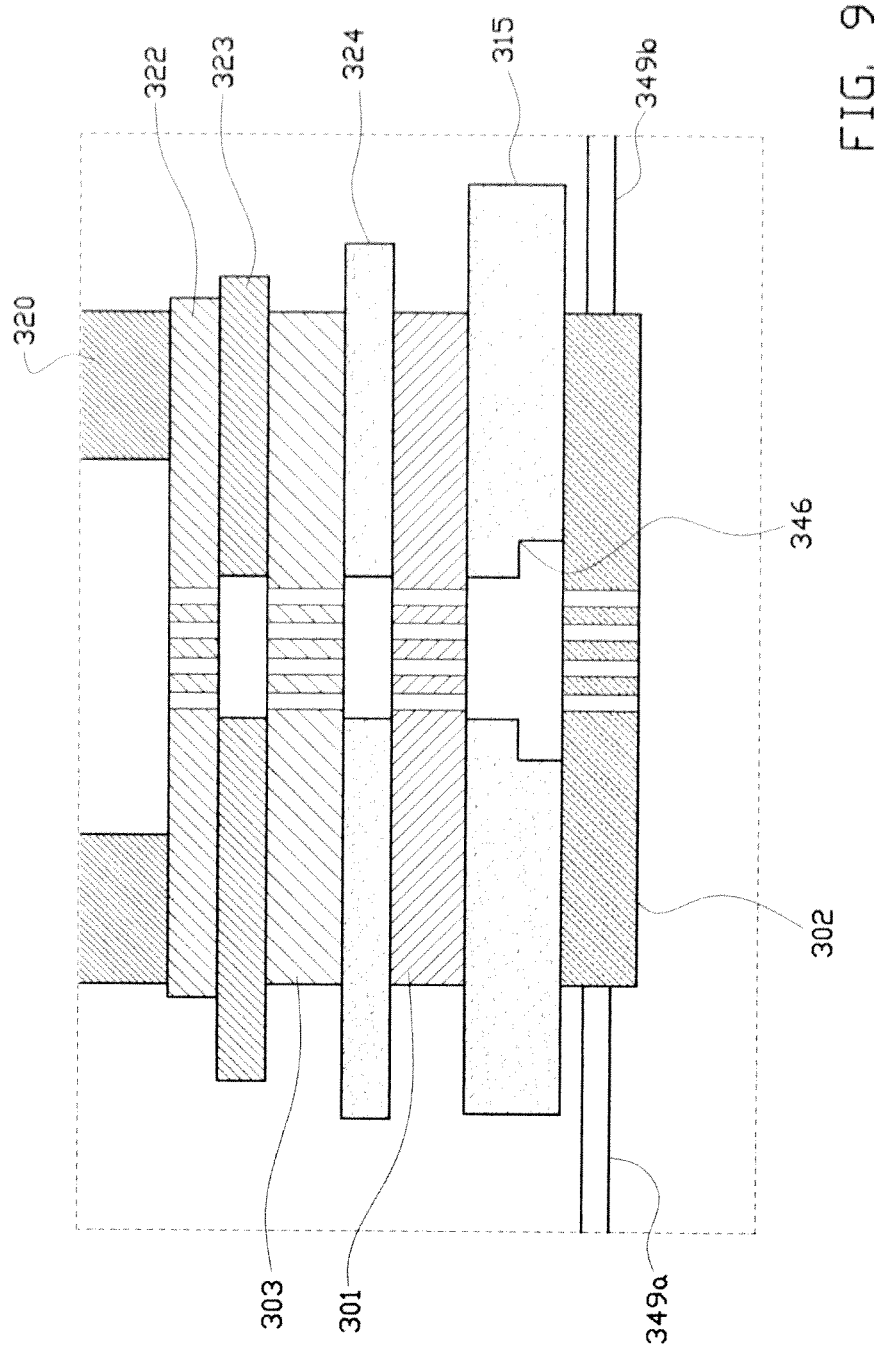
FIG. 9 shows a cross-sectional schematic diagram of a portion of a further embodiment of a projection lens assembly according to the invention.

FIG. 9 shows a schematic diagram of a section of an alternative projection lens assembly according to the invention. The projection lens assembly is constructed in a manner similar to the projection lens assembly shown in FIG. 8A, and comprises, besides first electrode 301 and second electrode 302, a third electrode 303, also provided with an aperture array, is arranged upstream of the first electrode 301. Preferably, neighboring elements are bonded to each other using suitable adhesives.

The third and first electrodes 303,301 are spaced apart and electrically isolated from each other by insulating spacer 324. The third electrode is conductively connected to the outer surface of deflector unit 320, through conductive beam stop array 322 and conductive spacer 323. The outer surface of deflector unit 320, and therefore the third electrode as well, is preferably kept at a constant potential, for example at −4 kV with respect to ground. The second electrode 302 is electrically connected to the circumferential wall (not shown) via positioning elements 349a and 349b, and insulated and spaced apart from first electrode 301 by non-conductive spacer 315. The positioning elements serve to align the downstream end of the beam optics along a plane spanned by the second electrode, i.e. in the orientation shown the positioning elements horizontally align the downstream end of the beam optics. Non-conductive spacer 315 is provides with a stepped portion 346 which increases the length of a path from the first electrode to the second electrode along the surface of spacer 315. This increased path length helps to reduce the chance of spark occurring between the first and second electrodes.

The circumferential wall and second electrode 302 are preferably kept at the same substantially constant potential as the target to be patterned, typically at ground potential. By varying the potential of the first electrode 301, the electrical fields between the first electrode 301 and the third electrode 303 can be varied, as well as the electrical fields between the first electrode 301 and the second electrode 302. The potential of the first electrode may typically be varied in the range of −4.3 kV. In this manner an array of electrostatic lenses is formed, capable of generating adaptable electrical fields for focusing a multitude of charged particle beamlets.

Figure 10:
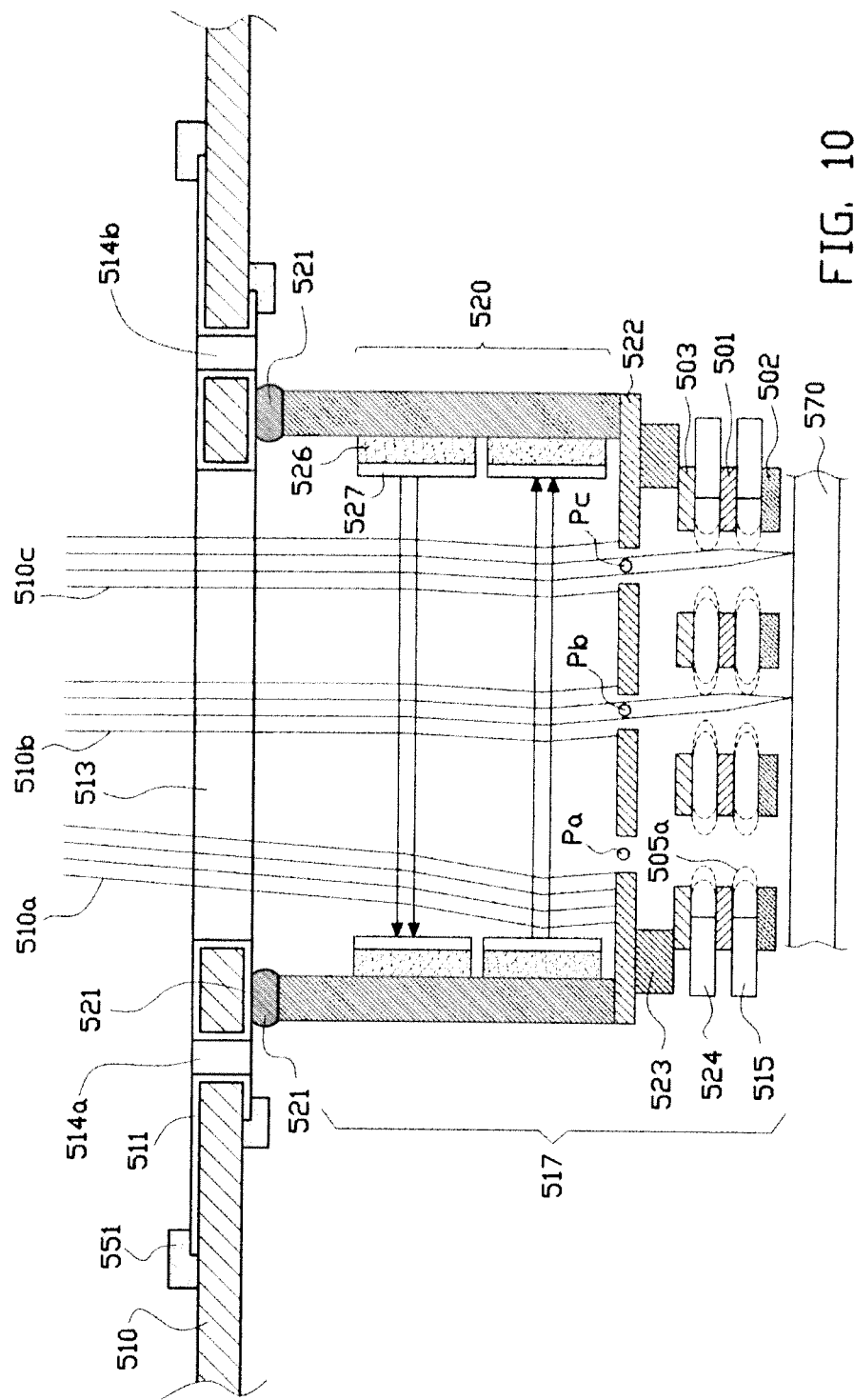
FIG. 10 shows a cross-sectional schematic diagram of a portion of a projection lens assembly according to the invention.

A schematic diagram of charged particle beamlet trajectories in an embodiment of the projection lens assembly 700 according to the invention is given in FIG. 10. In this embodiment a beam stop array 522 has been arranged between deflector unit 520 and third electrode 503. Beamlets 510a, 510b and 510c pass through deflector unit 520 which is adapted to provide a scanning deflection of said beamlets in the X- and Y-directions. Enveloped by the conductive outer surface of the deflector unit 520, are deflector plates 527 which are electrically isolated from the outer surface of the deflector unit by spacers comprising an isolating material 526.

Before reaching the deflector unit, beamlet 510a has been given a blanking deflection, and is therefore directed onto a non-beamlet passing region of beam stop array 522. The unblanked beamlets 510b and 510c traverse the deflector unit, and are deflected about their corresponding pivot points Pb and Pc which are located in substantially the same plane as beam stop array 522. As the pivot point of each beamlet is in substantially the same plane as the beam stop array, unblanked beam spots do not move on the beam stop array, i.e. the deflection by the deflector unit does not substantially influence the intensity distribution of unblanked beamlets at their corresponding pivot points. Unblanked beamlets 510*b* and 510*c* then pass the lens holes in the first and second electrodes 501, 502, between which electric fields 505*a* are generated which are adapted to focus the charged particle beamlets onto a target 570. The electrodes are spaced apart by spacers 523, 524 and 515. Because the beam stop array and the pivot points of the beamlets in this arrangement may be positioned relatively close to the electrodes, in particular closer to the planes spanned by the electrodes than if the beam stop array were placed upstream of the deflector unit, beamlet aberration is significantly reduced. This results in more sharply defined beamlet spots on the target and allows patterning of the target at higher resolutions.

Figure 11:
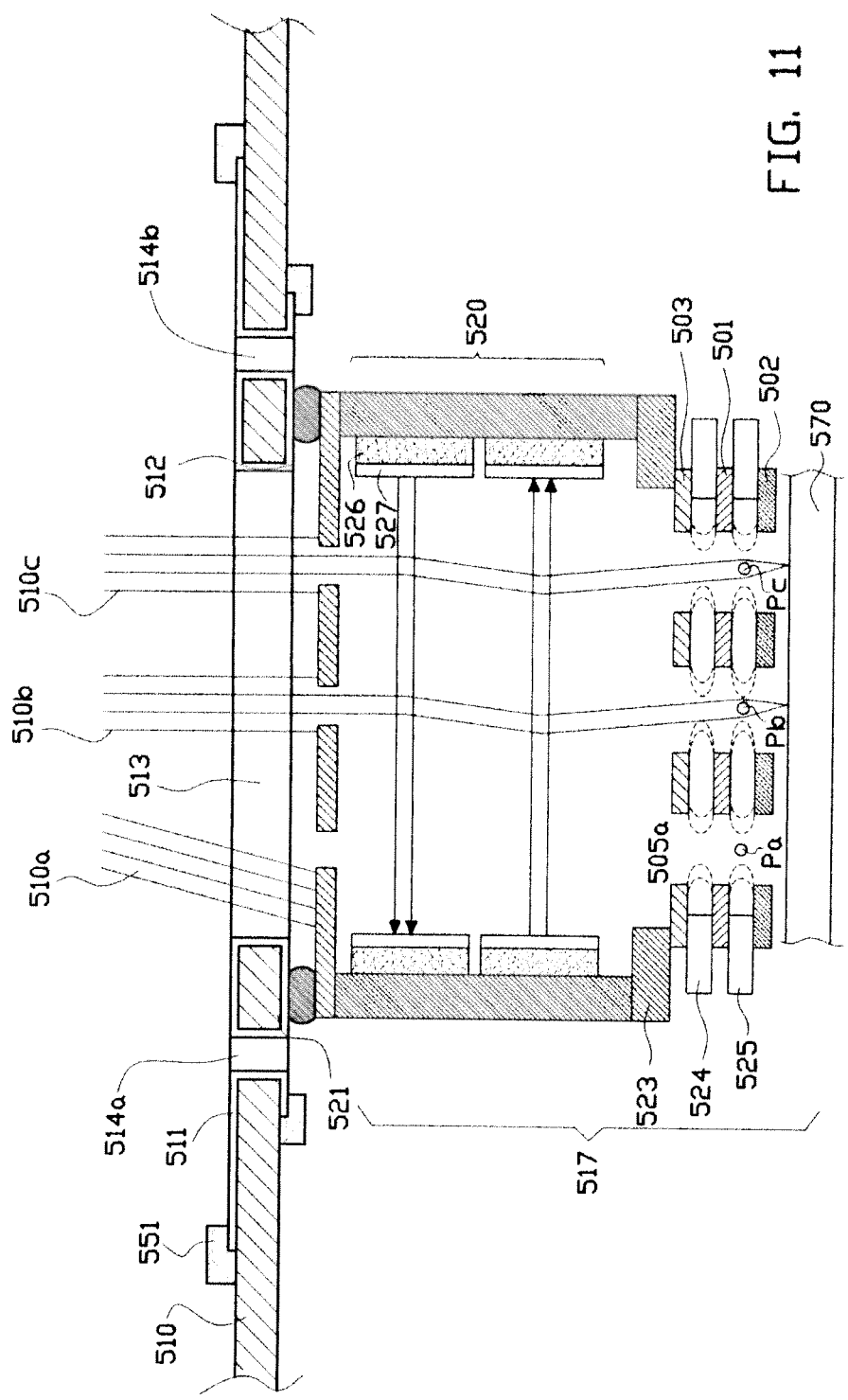
FIG. 11 shows a cross-sectional schematic diagram of a portion of a projection lens assembly according to the invention.

FIG. 11 shows an alternative embodiment of a projection lens assembly according to the invention, wherein the beam stop array 522 is arranged upstream of the deflector unit 520. Charged particle beamlet 510*a* has been given a blanking deflection before reaching the beam stop array and therefore impinges on a non-beamlet passing region thereof. Charged particle beamlets 510*b* and 510*c* pass the beam stop array 522 and are given a scanning deflection by deflector unit 520. The beamlets are then focused using electrodes 501,502,503 before striking the target 570. Because the second electrode 502 forms the downstream distal end of the projection lens assembly, the charged particle beamlets may have their pivot points positioned very close to the target 570 while staying focused substantially independent of the scanning deflection. Though in the embodiment shown scanning deflection of the beamlets is performed using a macro deflector which is adapted for providing two electrical fields, in an alternative embodiment the deflector unit may be adapted to provide several fields for scanning deflection of the beamlets, e.g. one or more electrical fields per beamlet, as shown in FIG. 1A, or one or more electrical fields per group of beamlets.

Figure 12A:
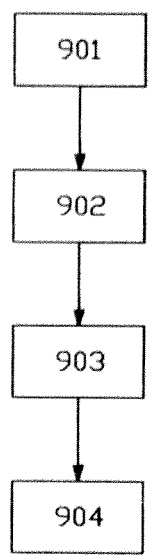
FIGS. 12A and 12B show flow charts of embodiments of the method according to the present invention.

FIG. 12A shows a flow chart of a method for assembling some of the embodiments mentioned above. In step 901 the beam optics are aligned with the through opening of the cover element such that the beam optics and the cover element are at a predetermined distance from each other. Next, in step 902 the aligned cover element is attached to an upstream end of the housing such that it overlaps the upstream edge of the housing. In step 903 a gap between the beam optics and the cover element is filled up with a body of adhesive for substantially supportingly bonding the beam optics to the cover element. Finally, in step 904 the body of adhesive is allowed to cure. The method allows more convenient manufacture of such projection lens assemblies, which can also be more accurately dimensioned using the method.

Figure 12B:
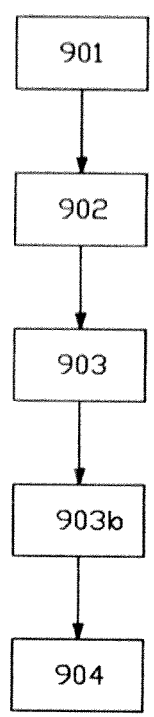

FIG. 12B shows an alternative embodiment of the method, in which the distance between the cover element and the downstream distal edge of the beam optics of a projection lens assembly is adjusted during construction of the projection lens assembly in step 903*b*, before the adhesive cures. This method allows adjustment of said distance to a predetermined value. During this adjustment step it is possible to measure beam focusing properties, for instance by arranging a beam profile sensor for the multitude of beamlets downstream of the projection lens assembly during construction, and measuring corresponding beam profiles while adjusting the distance. In an alternative embodiment the distance is adjusted to a predetermined value.

In summary the present invention discloses a projection lens assembly for directing a multitude of charged particle beamlets onto an image plane located in a downstream direction, and a method for assembling such a projection lens assembly. In particular the present invention discloses a modular projection lens assembly with enhanced structural integrity and/or increased placement precision of its most downstream electrode.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention. For instance, the principle of the invention can also be applied to projection lens assemblies for directing one or more beams of light onto an image plane. In this case the electrodes may be replaced with light optics, and the beam blanker may be replaced with a light modulator. As a further example, multiple beamlets may pass through the same holes in the lens hole array of the first and second electrodes. Moreover, a projection lens assembly according to the invention may comprise any number of electrodes greater than or equal to two without deviating from the scope of the invention.

The invention claimed is:

1. Projection lens assembly for directing a multitude of charged particle beamlets onto an image plane, said projection lens assembly comprising:
   a beam stop array comprising an array of apertures, for blocking charged particle beamlets provided with a blanking deflection by a beam blanker and letting through charged particle beamlets not provided with a blanking deflection by said beam blanker,
   at least one support element comprising a through-opening for allowing the multitude of charged particle beamlets to pass through,
   a first electrode and a second electrode, said first electrode and second electrode supported by said at least one support element, wherein the first and second electrode are arranged in or near a plane defined by a downstream distal edge of the projection lens assembly,
   said first and second electrodes each comprising a lens hole-array aligned with the through-opening for allowing one or more charged particle beamlets of the multitude of charged particle beamlets to pass through,
   said projection lens assembly further comprising:
   a deflector unit arranged upstream from said first and second electrode and downstream from said beam blanker,
   an annular body comprising a conductive circumferential wall,
   wherein the annular body and the support element are electrically connected and set substantially at ground potential.

2. Projection lens assembly according to claim 1, wherein said support element comprises a main layer of an insulating material.

3. Projection lens assembly according to claim 1 or claim 2, wherein a downstream surface of said support element is substantially coated with a conductive coating connected to the second electrode.

4. Projection lens assembly according to claim 1 wherein the second electrode is electrically connected to the support element.

5. Projection lens assembly according to claim 1, wherein the deflector unit is electrically connected to the annular body for providing a grounding connection.

6. Projection lens assembly according to claim 1, further comprising a third electrode arranged upstream from said first and second electrodes for focusing one or more charged particle beamlets of the multitude of charged particle beamlets in conjunction with said first and second electrodes.

7. Projection lens assembly according to claim 6, wherein the third electrode and the second electrode are kept substantially at ground potential by electrically connecting the second and third electrodes to the support element, and the first electrode is kept at a different substantially constant potential.

8. Projection lens assembly according to claim 7, further comprising two spacers for electrically insulating the first electrode from the second and third electrodes, wherein the first electrode is included in between said two spacers for electrically insulating the first electrode from the second.

9. Projection lens assembly according to claim 8, wherein at least one of the electrodes has a portion at least partially extending outside the area occupied by one of the spacers.

10. Projection lens assembly according to claim 9, wherein an electrical lead is attached to said portion.

11. Projection lens assembly according to claim 10, wherein said electrical lead is adapted for providing an electrical signal to the at least one of the electrodes.

12. Projection lens assembly according to claim 10, wherein said electrical lead is adapted for connecting the at least one of the electrodes to ground potential.

13. Projection lens assembly according to claim 6, wherein said beam stop array is arranged between said deflector unit and said third electrode on top of a spacer.

14. Projection lens assembly according to claim 13, wherein the beam stop has a portion at least partially extending outside the area occupied the spacer.

15. Projection lens assembly according to 14, wherein an electrical lead is attached to said portion adapted for connecting the third electrode to ground potential.

16. Projection lens assembly according to claim 6, further comprising a scanning deflector unit for scanning the charged particle beamlets over the image plane, wherein said scanning deflector unit is included downstream from said beam stop array and upstream from the third electrode, wherein the scanning deflector is provided with a grounding connection.

17. Projection lens assembly according to claim 16, wherein said scanning deflector unit comprises micro-electro mechanical system element adapted for providing scanning deflection of groups of said beamlets.

18. Projection lens assembly according to claim 16, wherein said scanning deflector, said first electrode and said third electrode are arranged substantially within a volume bounded by the circumferential wall of the annular body and the support element.

19. Projection lens assembly according to claim 16, wherein said support element substantially supports said deflector unit, said scanning deflector, said first electrode, said second electrode and/or said beam stop array.

20. Projection lens assembly according to claim 1, wherein the outer edges of the first electrode are encapsulated by a non-conductive adhesive for preventing the forming of sparks at the outer edges of the first electrode.

21. Projection lens assembly according to claim), wherein the support element, the first electrode and the second electrode are substantially planar.

22. Projection lens assembly according to claim 1, wherein the potential difference between the first and second electrodes is in the range of 4 kV.

23. Projection lens assembly according to claim 1, wherein said second electrode is attached to a downstream facing side of said support element, and said first electrode is attached to an opposite, upstream facing said of said support element.

24. Lithography system comprising
a beam source for generating said multitude of charged particle beamlets,
a beam blanker, arranged downstream of said beam source, for selectively providing said charged particle beamlets with a blanking deflecting,
a projection lens assembly according to claim 1, arranged downstream of said beam blanker.

* * * * *

UNITED STATES PATENT AND TRADEMARK OFFICE
CERTIFICATE OF CORRECTION

PATENT NO. : 8,716,671 B2
APPLICATION NO. : 13/722774
DATED : May 6, 2014
INVENTOR(S) : Johan Joost Koning, Stijn Willem Herman Karel Steenbrink and Bart Schipper Page 1 of 1

It is certified that error appears in the above-identified patent and that said Letters Patent is hereby corrected as shown below:

Title Page, below Item (72) insert --(73) Assignee: Mapper Lithography IP B.V.--.

In the Claims,

Column 22, Claim 21, line 20, please delete "claim )" and insert --claim 1--.

Column 22, Claim 23, line 29, please delete "facing said" and insert --facing side--.

Signed and Sealed this
Eighteenth Day of November, 2014

Michelle K. Lee
*Deputy Director of the United States Patent and Trademark Office*